United States Patent
Seregin et al.

(10) Patent No.: US 9,621,894 B2
(45) Date of Patent: Apr. 11, 2017

(54) DETERMINING CONTEXTS FOR CODING TRANSFORM COEFFICIENT DATA IN VIDEO CODING

(71) Applicant: Qualcomm Incorporated, San Diego, CA (US)

(72) Inventors: Vadim Seregin, San Diego, CA (US); Joel Sole Rojals, La Jolla, CA (US); Marta Karczewicz, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 421 days.

(21) Appl. No.: 13/738,602

(22) Filed: Jan. 10, 2013

(65) Prior Publication Data

US 2013/0182758 A1 Jul. 18, 2013

Related U.S. Application Data

(60) Provisional application No. 61/586,668, filed on Jan. 13, 2012, provisional application No. 61/588,595, filed on Jan. 19, 2012, provisional application No. 61/597,097, filed on Feb. 9, 2012.

(51) Int. Cl.
| | |
|---|---|
| *H04N 19/119* | (2014.01) |
| *H04N 19/13* | (2014.01) |
| *H04N 19/91* | (2014.01) |
| *H04N 19/18* | (2014.01) |
| *H03M 7/40* | (2006.01) |

(52) U.S. Cl.
CPC .......... *H04N 19/119* (2014.11); *H04N 19/13* (2014.11); *H04N 19/18* (2014.11); *H04N 19/91* (2014.11); *H03M 7/4018* (2013.01)

(58) Field of Classification Search
CPC ................................. H04N 19/00072
USPC ....................... 375/240.01, 240.02
IPC ........................................ H04N 7/26
See application file for complete search history.

(56) References Cited

U.S. PATENT DOCUMENTS

| | | |
|---|---|---|
| 6,680,974 B1 | 1/2004 | Faryar et al. |
| 8,599,925 B2 | 12/2013 | Srinivasan |
| 8,780,999 B2 | 7/2014 | Chen et al. |
| 8,914,835 B2 | 12/2014 | Chen et al. |
| 2005/0123207 A1 | 6/2005 | Marpe et al. |

(Continued)

FOREIGN PATENT DOCUMENTS

| | | |
|---|---|---|
| EP | 2590409 A1 | 5/2013 |
| JP | 2013098988 A | 5/2013 |

(Continued)

OTHER PUBLICATIONS

Bross et al., "High efficiency video coding (HEVC) text specification draft 10 (For FDIS & Last Call)," 12th Meeting: Geneva, CH, Jan. 14-23, 2013, JCTVC-L1003_v34, 310 pp.

(Continued)

*Primary Examiner* — Yulin Sun
(74) *Attorney, Agent, or Firm* — Shumaker & Sieffert, P.A.

(57) ABSTRACT

In one example, a device for coding video data includes a video coder configured to determine values for coded sub-block flags of one or more neighboring sub-blocks to a current sub-block, determine a context for coding a transform coefficient of the current sub-block based on the values for the coded sub-block flags, and entropy code the transform coefficient using the determined context.

52 Claims, 14 Drawing Sheets

(56) References Cited

U.S. PATENT DOCUMENTS

| | | |
|---|---|---|
| 2007/0071088 A1 | 3/2007 | Lee et al. |
| 2007/0110153 A1 | 5/2007 | Cho et al. |
| 2008/0219578 A1 | 9/2008 | Lee |
| 2009/0175331 A1 | 7/2009 | Karczewicz et al. |
| 2009/0232204 A1 | 9/2009 | Lee et al. |
| 2010/0086057 A1* | 4/2010 | Xiao .............. H04N 19/70 375/240.24 |
| 2010/0174539 A1 | 7/2010 | Nandhimandalam et al. |
| 2010/0329342 A1 | 12/2010 | Joshi et al. |
| 2011/0310973 A1 | 12/2011 | Cheon et al. |
| 2012/0082218 A1 | 4/2012 | Misra et al. |
| 2012/0082232 A1 | 4/2012 | Sole Rojals et al. |
| 2012/0082235 A1 | 4/2012 | Lou et al. |
| 2012/0183235 A1 | 7/2012 | Sasai et al. |
| 2012/0207222 A1 | 8/2012 | Lou et al. |
| 2013/0101046 A1 | 4/2013 | Korodi et al. |
| 2013/0107969 A1* | 5/2013 | Nguyen et al. .......... 375/240.18 |
| 2013/0128985 A1 | 5/2013 | He et al. |
| 2014/0348247 A1 | 11/2014 | Tsukuba et al. |

FOREIGN PATENT DOCUMENTS

| | | |
|---|---|---|
| JP | 2013110740 A | 6/2013 |
| RU | 2371881 C1 | 10/2009 |
| RU | 2417518 C2 | 4/2011 |
| TW | 201108205 A | 3/2011 |
| TW | 201130312 A | 9/2011 |
| TW | 201138471 A | 11/2011 |
| WO | 03027940 A1 | 4/2003 |
| WO | 2007008018 A1 | 1/2007 |
| WO | 2008108534 A1 | 9/2008 |
| WO | 2011128303 A2 | 10/2011 |
| WO | 2011142817 A1 | 11/2011 |
| WO | 2013099892 A1 | 7/2013 |

OTHER PUBLICATIONS

Bross et al., "High efficiency video coding (HEVC) text specification draft 6," 8th Meeting: San Jose, CA, USA, Feb. 1-10, 2012, JCTVC-H1003, 259 pp.

International Search Report and Written Opinion from International Application No. PCT/US2013/021278, dated Jan. 10, 2014, 11 pp.

ITU-T H.265, Series H: Audiovisual and Multimedia Systems, Infrastructure of audiovisual services—Coding of moving video, High efficiency video coding, The International Telecommunication Union, Apr. 2013, 317 pages.

Nguyen et al., "Significant Coefficient Flag Context Models for Modular Processing", JCT-VC Meeting; MPEG Meeting; Feb. 1, 2012-Feb. 10, 2012; San Jose; (Joint Collaborative Team on Video Coding of ISO/IEC JTC1/SC29/WG11 and ITU-T SG. 16); URL: http://wftp3.1tu.int/av-arch/jctvc-site/, No. JCTVC-H0411, XP030111438, 7 pp.

Nguyen, et al., "Multi-level Significant Maps for Large Transform Units", JCT-VC Meeting; MPEG Meeting; Nov. 21, 2011-Nov. 30, 2011; Geneva; (Joint Collaborative Team on Video Coding of ISO/IEC JTC1/SC29/WG11 and ITU-T SG.16); URL: http://wftp3.itu.int/av-arch/jctvc-site/, No. JCTVC-G644, XP030110628, 12 pp.

International Preliminary Report on Patentability from International Application No. PCT/US2013/021278, dated Jul. 9, 2014, 6 pp.

Second Written Opinion from International Application No. PCT/US2013/021278, dated May 26, 2014, 5 pp.

Bross et al., "High efficiency video coding (HEVC) text specification draft 6," Joint Collaborative Team on Video Coding, JCTVC-H1003, Nov. 21-30, 2011, 259 pp.

Bross et al., "High efficiency video coding (HEVC) text specification draft 7," Joint Collaborative Team on Video Coding, JCTVC-I1003_D2, Apr. 27-May 7, 2012, 290 pp.

Bross et al., "High efficiency video coding (HEVC) text specification draft 8," Joint Collaborative Team on Video Coding, JCTVC-J1003_D7, Jul. 11-20, 2012, 261 pp.

Bross et al., "High efficiency video coding (HEVC) text specification draft 9," Joint Collaborative Team on Video Coding, JCTVC-K1003_v7, Oct. 10-19, 2012, 290 pp.

Bross et al., "WD4: Working Draft 4 of High-Efficiency Video Coding," Joint Collaborative Team on Video Coding, JCTVC-F803_d2, Jul. 14-22, 2011, 226 pp.

Bross et al., "WD5: Working Draft 5 of High-Efficiency Video Coding," Joint Collaborative Team on Video Coding, JCTVC-G1103_d2, Nov. 21-30, 2011, 214 pp.

U.S. Appl. No. 13/738,534, by Vadim Seregin, filed Jan. 10, 2013.

U.S. Appl. No. 13/738,574, by Vadim Seregin, filed Jan. 10, 2013.

International Telecommunication Union, "Advanced video coding for generic audiovisual services," Standardization Sector of ITU, Jun. 2011, 674 pp.

Terada et al., "Non-CE11: Simplification of context selection for significant_coeff_flag," Joint Collaborative Team on Video Coding, JCTVC-H0290, Feb. 1-10, 2012, 9 pp.

Wiegand et al., "WD2: Working Draft 2 of High-Efficiency Video Coding", Joint Collaborative Team on Video Coding, JCTVC-D503, Jan. 20-28, 2011, 153 pp.

Wiegand et al., "WD3: Working Draft 3 of High-Efficiency Video Coding," Joint Collaborative Team on Video Coding, JCTVC-E603, Mar. 16-23, 2011,193 pp.

Wiegand et al.,"WD1: Working Draft 1 of High-Efficiency Video Coding", Joint Collaborative Team on Video Coding, JCTVC-C403, Oct. 7-15, 2010, 137 pp.

"ITU-T H.265, Series H: Audiovisual and Multimedia Systems, Infrastructure of audiovisual services—Coding of moving video, High efficiency video coding, The International Telecommunication Union, Oct. 2014, 540 pp."

Chen J., et al., "AHG5—Context Derivation Clean-up for Significance Map," Joint Collaborative Team on Video Coding (JCT-VC) of ITU-T SG 16 WP 3 and ISO/IEC JTC 1/SC 29/WG 11 9th Meeting: Geneva, CH, Apr. 27-May 7, 2012, Apr. 20, 2012, JCTVC-I0373, http://phenix.it-sudparis.eu/jct/doc_end_user/documents/9_Geneva/wg11/JCTVC-I0373v2.zip.

Sole J., et al., "CE11: Unified scans for the significance map and coefficient level coding in high efficiency", JCTVC-F288, Joint Collaborative Team on Video Coding (JCT-VC) of ITU-T SG16 WP3 and ISO/IEC JTC1/SC29/WG11, 6th Meeting: Torino (Italy), Dec. 11, 2012, pp. 1-9.

Tsukuba T., et al., "Non-CE11.1: Context Reduction of Significance Map Coding," Joint Collaborative Team on Video Coding (JCT-VC) of ITU-T SG16 WP3 and ISO/IECJTC1/SC29/WG11 8th Meeting: San Jose, CA, USA, Feb. 1-10, 2012, Feb. 1, 2012, JCTVC-H0100, http://phenix.it-sudparis.eu/jct/doc_end_user/documents/8_San%20Jose/wg11/JCTVC-H0100-v5.zip.

\* cited by examiner

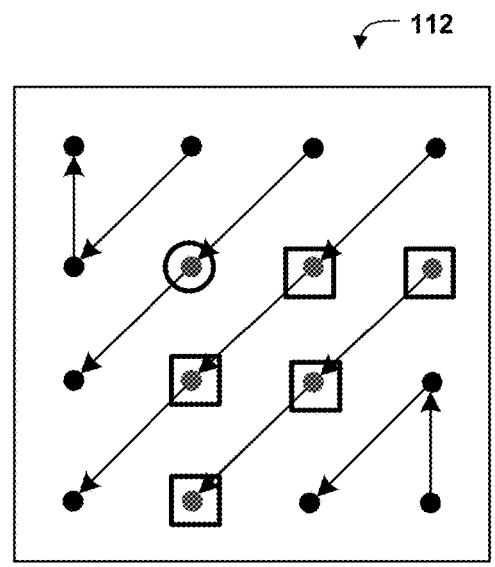
FIG. 7
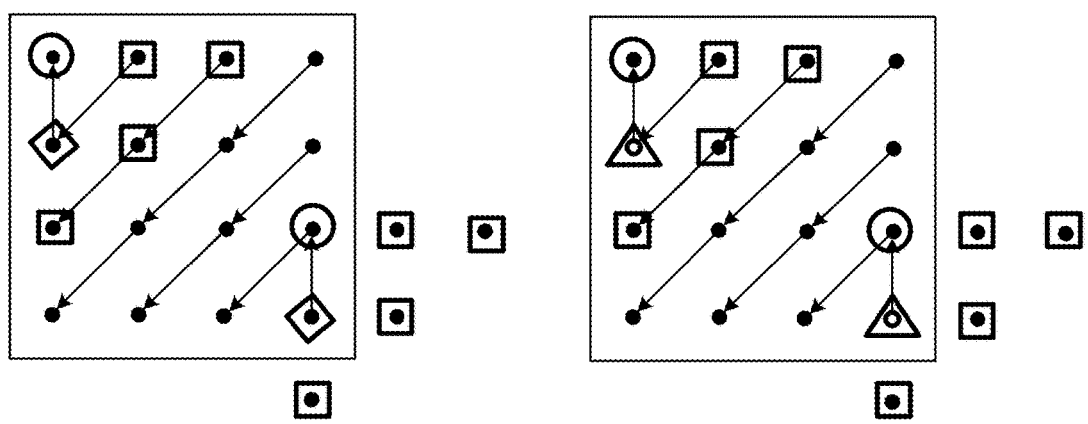
FIG. 8A  FIG. 8B

DETERMINING CONTEXTS FOR CODING TRANSFORM COEFFICIENT DATA IN VIDEO CODING

This application claims the benefit of U.S. Provisional Application Ser. No. 61/586,668, filed Jan. 13, 2012, U.S. Provisional Application Ser. No. 61/588,595, filed Jan. 19, 2012, and U.S. Provisional Application Ser. No. 61/597,097, filed Feb. 9, 2012, each of which is hereby incorporated by reference in its entirety.

TECHNICAL FIELD

This disclosure relates to video coding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video compression techniques, such as those described in the standards defined by MPEG-2, MPEG-4, ITU-T H.263, ITU-T H.264/MPEG-4, Part 10, Advanced Video Coding (AVC), the High Efficiency Video Coding (HEVC) standard presently under development, and extensions of such standards. The video devices may transmit, receive, encode, decode, and/or store digital video information more efficiently by implementing such video compression techniques.

Video compression techniques perform spatial (intra-picture) prediction and/or temporal (inter-picture) prediction to reduce or remove redundancy inherent in video sequences. For block-based video coding, a video slice (i.e., a video frame or a portion of a video frame) may be partitioned into video blocks, which may also be referred to as treeblocks, coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to a reference frames.

Spatial or temporal prediction results in a predictive block for a block to be coded. Residual data represents pixel differences between the original block to be coded and the predictive block. An inter-coded block is encoded according to a motion vector that points to a block of reference samples forming the predictive block, and the residual data indicating the difference between the coded block and the predictive block. An intra-coded block is encoded according to an intra-coding mode and the residual data. For further compression, the residual data may be transformed from the pixel domain to a transform domain, resulting in residual transform coefficients, which then may be quantized. The quantized transform coefficients, initially arranged in a two-dimensional array, may be scanned in order to produce a one-dimensional vector of transform coefficients, and entropy coding may be applied to achieve even more compression.

SUMMARY

In general, this disclosure describes techniques related to determining contexts for entropy coding, e.g., using context-adaptive binary arithmetic coding (CABAC), of video data. CABAC coding generally involves determining a context when coding binarized representations of various syntax elements. Examples of syntax elements include data for transform coefficients, such as data indicating whether the transform coefficients are significant, signs of the transform coefficients that are significant, and level values for the transform coefficients that are significant. Transform coefficients generally correspond to coefficients of a transform block, such as a transform unit (TU). This disclosure describes techniques for determining contexts for coding transform coefficients based on regions of a transform block in which the transform coefficients occur.

In one example, a method of coding video data includes determining a context for coding a transform coefficient of a video block based on a region of the video block in which the transform coefficient occurs, and entropy coding the transform coefficient using the determined context.

In another example, a device for coding video data includes a video coder configured to determine a context for coding a transform coefficient of a video block based on a region of the video block in which the transform coefficient occurs, and entropy code the transform coefficient using the determined context.

In another example, a device for coding video data includes means for determining a context for coding a transform coefficient of a video block based on a region of the video block in which the transform coefficient occurs, and means for entropy coding the transform coefficient using the determined context.

In another example, a computer-readable storage medium has stored thereon instructions that, when executed, cause a processor to determine a context for coding a transform coefficient of a video block based on a region of the video block in which the transform coefficient occurs, and entropy code the transform coefficient using the determined context.

In another example, a method of decoding video data includes determining whether a transform coefficient of a video block is a DC transform coefficient, when the transform coefficient is determined to be the DC transform coefficient of the video block, determining a context for decoding the transform coefficient based on the transform coefficient being the DC transform coefficient without regard for a size of the video block, and entropy decoding the transform coefficient using the determined context.

In another example, a device for decoding video data includes a video decoder configured to determine whether a transform coefficient of a video block is a DC transform coefficient, when the transform coefficient is determined to be the DC transform coefficient of the video block, determine a context for decoding the transform coefficient based on the transform coefficient being the DC transform coefficient without regard for a size of the video block, and entropy decode the transform coefficient using the determined context.

In another example, a device for decoding video data includes means for determining whether a transform coefficient of a video block is a DC transform coefficient, means for determining, when the transform coefficient is determined to be the DC transform coefficient of the video block, a context for decoding the transform coefficient based on the transform coefficient being the DC transform coefficient without regard for a size of the video block, and means for entropy decoding the transform coefficient using the determined context.

In another example, a computer-readable storage medium has stored thereon instructions that, when executed, cause a processor to determine whether a transform coefficient of a video block is a DC transform coefficient, when the transform coefficient is determined to be the DC transform coefficient of the video block, determine a context for decoding the transform coefficient based on the transform coefficient being the DC transform coefficient without regard for a size of the video block, and entropy decode the transform coefficient using the determined context.

In another example, a method of encoding video data includes determining whether a transform coefficient of a video block is a DC transform coefficient, when the transform coefficient is determined to be the DC transform coefficient of the video block, determining a context for encoding the transform coefficient based on the transform coefficient being the DC transform coefficient without regard for a size of the video block, and entropy encoding the transform coefficient using the determined context.

In another example, a device for encoding video data includes a video encoder configured to determine whether a transform coefficient of a video block is a DC transform coefficient, when the transform coefficient is determined to be the DC transform coefficient of the video block, determine a context for encoding the transform coefficient based on the transform coefficient being the DC transform coefficient without regard for a size of the video block, and entropy encode the transform coefficient using the determined context.

In another example, a device for encoding video data includes means for determining whether a transform coefficient of a video block is a DC transform coefficient, means for determining, when the transform coefficient is determined to be the DC transform coefficient of the video block, a context for encoding the transform coefficient based on the transform coefficient being the DC transform coefficient without regard for a size of the video block, and means for entropy encoding the transform coefficient using the determined context.

In another example, a computer-readable storage medium has stored thereon instructions that, when executed, cause a processor to determine whether a transform coefficient of a video block is a DC transform coefficient, when the transform coefficient is determined to be the DC transform coefficient of the video block, determine a context for encoding the transform coefficient based on the transform coefficient being the DC transform coefficient without regard for a size of the video block, and entropy encode the transform coefficient using the determined context.

In another example, a method of decoding video data includes determining values for coded sub-block flags of one or more neighboring sub-blocks to a current sub-block, determining a context for decoding a transform coefficient of the current sub-block based on the values for the coded sub-block flags, and entropy decoding the transform coefficient using the determined context.

In another example, a device for decoding video data includes a video decoder configured to determine values for coded sub-block flags of one or more neighboring sub-blocks to a current sub-block, determine a context for decoding a transform coefficient of the current sub-block based on the values for the coded sub-block flags, and entropy decode the transform coefficient using the determined context.

In another example, a device for decoding video data includes means for determining values for coded sub-block flags of one or more neighboring sub-blocks to a current sub-block, means for determining a context for decoding a transform coefficient of the current sub-block based on the values for the coded sub-block flags, and means for entropy decoding the transform coefficient using the determined context.

In another example, a computer-readable storage medium has stored thereon instructions that, when executed, cause a processor to determine values for coded sub-block flags of one or more neighboring sub-blocks to a current sub-block, determine a context for decoding a transform coefficient of the current sub-block based on the values for the coded sub-block flags, and entropy decode the transform coefficient using the determined context.

In another example, a method of encoding video data includes determining values for coded sub-block flags of one or more neighboring sub-blocks to a current sub-block, determining a context for encoding a transform coefficient of the current sub-block based on the values for the coded sub-block flags, and entropy encoding the transform coefficient using the determined context.

In another example, a device for encoding video data includes a video encoder configured to determine values for coded sub-block flags of one or more neighboring sub-blocks to a current sub-block, determine a context for encoding a transform coefficient of the current sub-block based on the values for the coded sub-block flags, and entropy encode the transform coefficient using the determined context.

In another example, a device for encoding video data includes means for determining values for coded sub-block flags of one or more neighboring sub-blocks to a current sub-block, means for determining a context for encoding a transform coefficient of the current sub-block based on the values for the coded sub-block flags, and means for entropy encoding the transform coefficient using the determined context.

In another example, a computer-readable storage medium has stored thereon instructions that, when executed, cause a processor to determine values for coded sub-block flags of one or more neighboring sub-blocks to a current sub-block, determine a context for encoding a transform coefficient of the current sub-block based on the values for the coded sub-block flags, and entropy encode the transform coefficient using the determined context.

The details of one or more examples are set forth in the accompanying drawings and the description below. Other features, objects, and advantages will be apparent from the description and drawings, and from the claims.

BRIEF DESCRIPTION OF DRAWINGS

FIG. 7 is a conceptual diagram that illustrates an example five-point support used to define a context model for a significance map of coefficients in a video block scanned using a reverse diagonal scanning order.

FIGS. 8A and 8B are conceptual diagrams that illustrate context dependency within the five-point support.

DETAILED DESCRIPTION

In general, this disclosure describes techniques related to determining contexts for entropy coding, e.g., using context-adaptive binary arithmetic coding (CABAC), of video data. CABAC coding generally involves determining a context when coding binarized representations of various syntax elements. Syntax elements include, for example, data for transform coefficients, such as data indicating whether the transform coefficients are significant, signs of the transform coefficients that are significant, and level values for the transform coefficients that are significant. Transform coefficients generally correspond to coefficients of a transform block, such as a transform unit (TU). This disclosure describes techniques for determining contexts for coding transform coefficients based on regions of a transform block in which the transform coefficients occur.

Figure 9A:
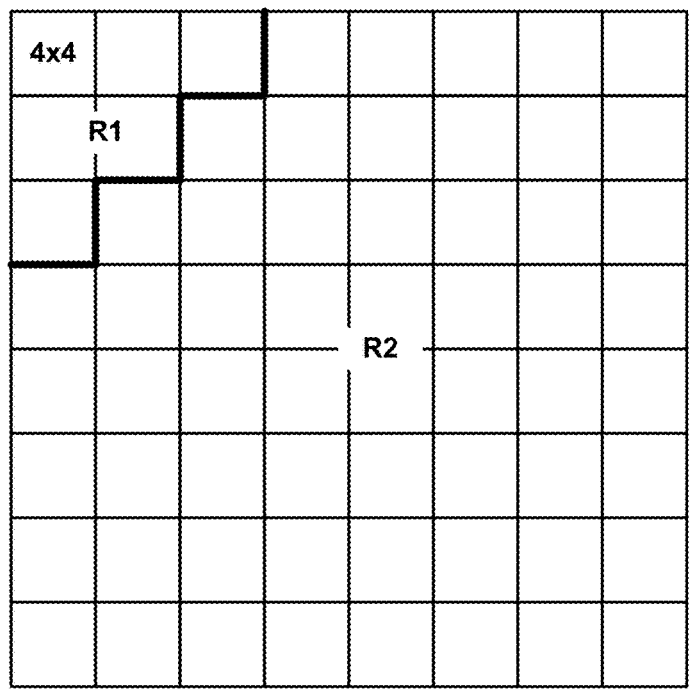
FIGS. 9A and 9B are conceptual diagrams that illustrate example divisions of a video block into two or more regions.
Figure 9B:
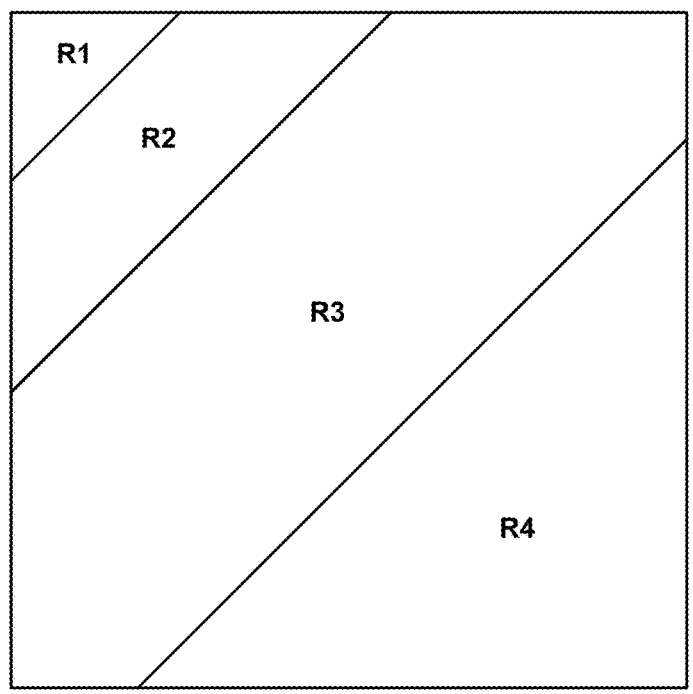
Figure 10:
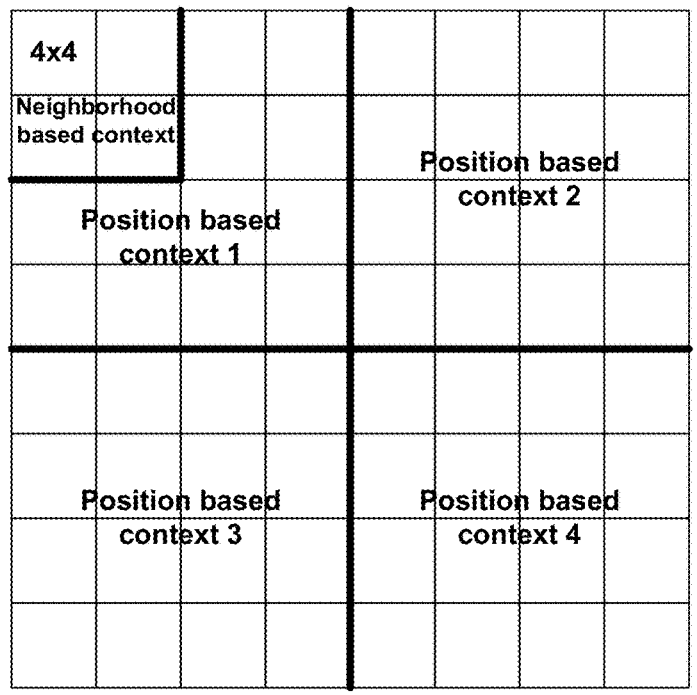
FIG. 10 is a conceptual diagram that illustrates example assignment of neighborhood- or position-based contexts for each region of a video block.
Figure 11:
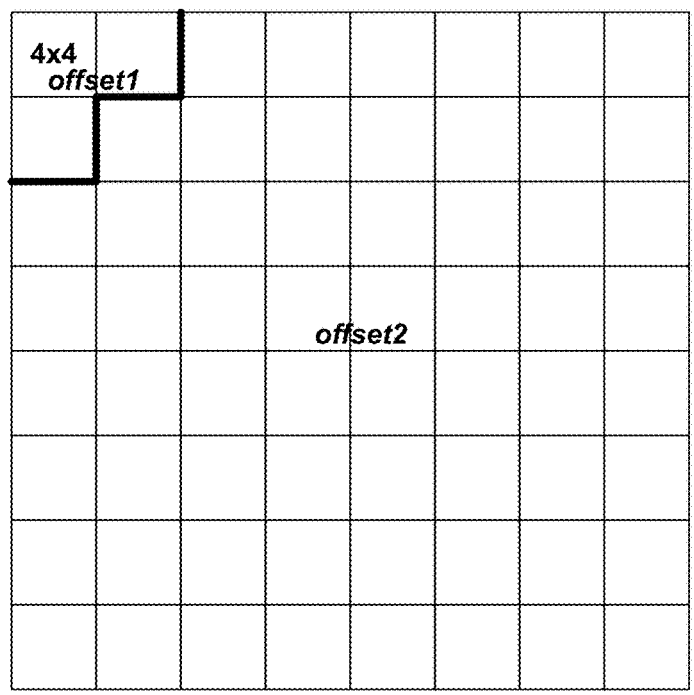
FIG. 11 is a conceptual diagram that illustrates example assignment of context offsets for each region of a video block.
Figure 12:
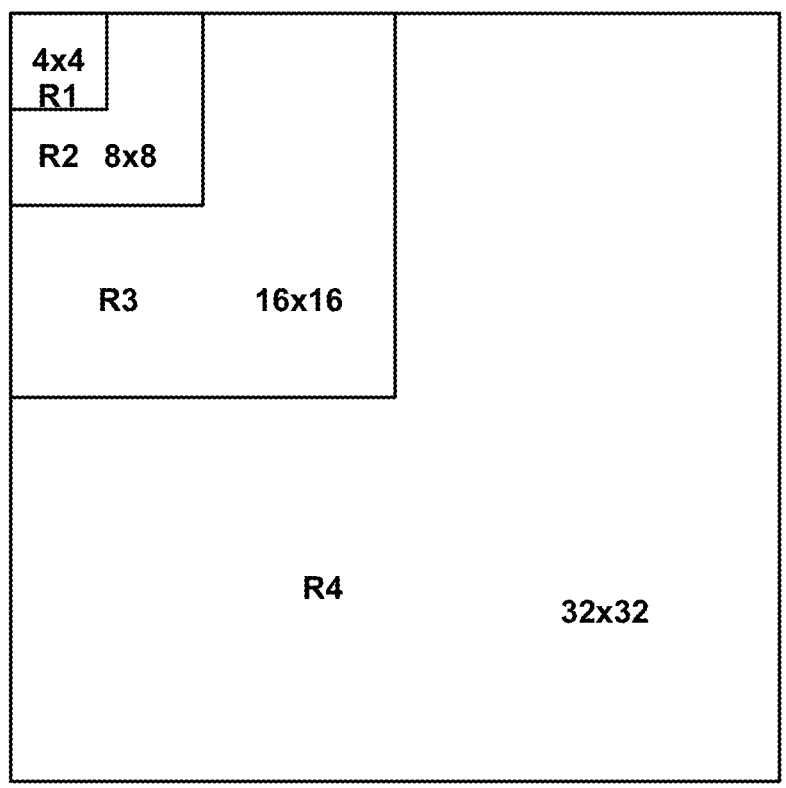
FIG. 12 is a conceptual diagram that illustrates an example embedded division of a video block into two or more regions based on TU sizes that correlate to existing context models.
Figure 13A:
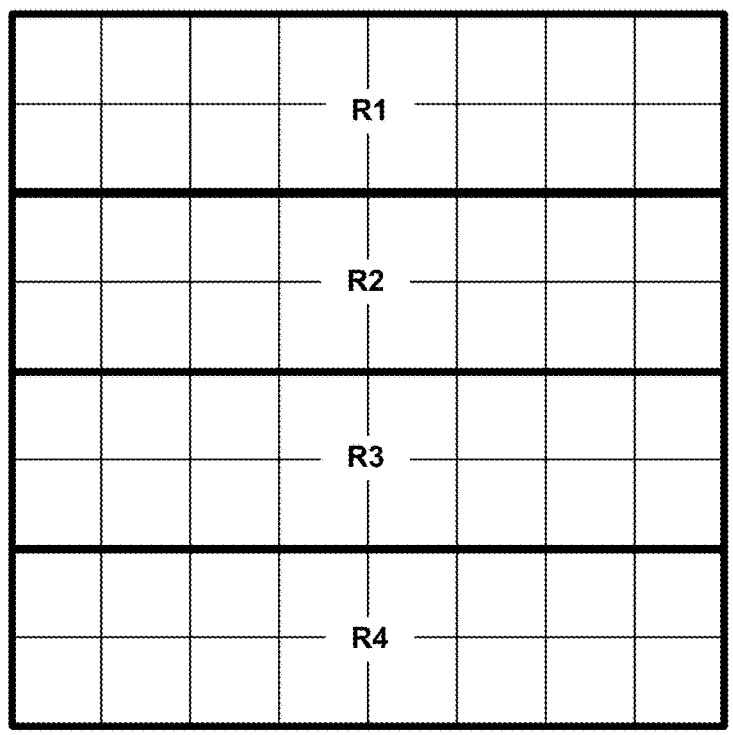
FIGS. 13A and 13B are conceptual diagrams that illustrate example divisions of a video block into two or more regions.
Figure 13B:
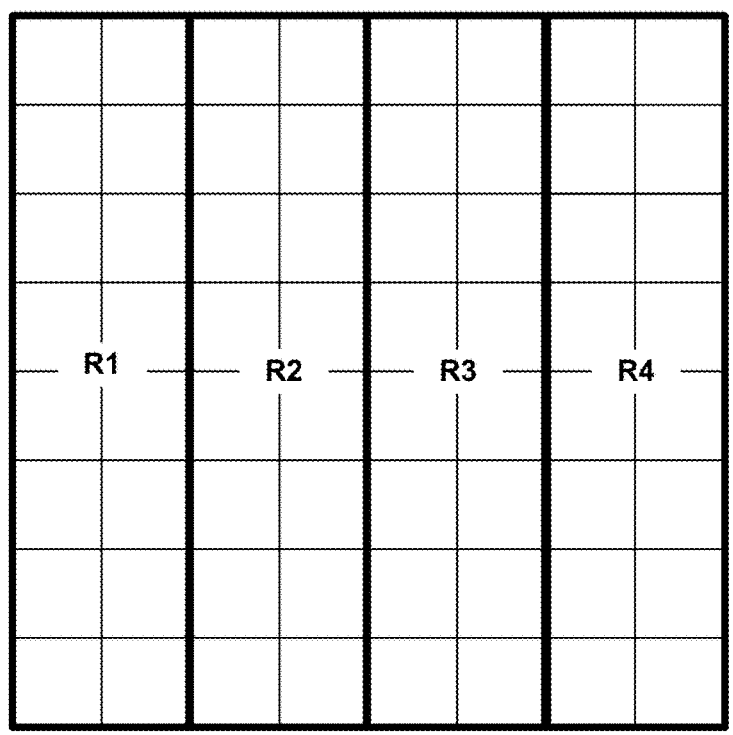

In general, in accordance with the techniques of this disclosure, a video coder may be configured to determine context for coding a transform coefficient based on a region in which the transform coefficient occurs and then entropy code the transform coefficient using the determined context. A video block may be divided into regions in a variety of ways. FIGS. 9A and 11 illustrate examples in which a video block is divided into a first region including one or more upper-left sub-blocks (e.g., 4×4 sub-blocks) and a second region including sub-blocks outside the first region. FIG. 9B illustrates an example in which a video block is divided into regions along a diagonal direction. FIG. 10 illustrates an example in which a video block is divided into quartiles, and the upper-left quartile is further divided into a first sub-region including sub-blocks of an upper-left portion of the upper-left quartile and a second sub-region including sub-blocks of the upper-left quartile external to the first sub-region. FIG. 12 illustrates an example in which a video block is divided into regions that correspond to video block sizes (e.g., 4×4, 8×8, 16×16, and 32×32). FIG. 13A illustrates an example in which a video block is divided into horizontal rectangular regions. FIG. 13B illustrates an example in which a video block is divided into vertical rectangular regions. These figures are described in greater detail below.

In various examples, a video coder may be configured to determine a context for coding a transform coefficient in various ways, e.g., based on a region in which the transform coefficient occurs. For example, a video coder may be configured to determine a context using position-based context information for some regions or neighborhood-based context information for other regions. In some examples, all transform coefficients within a particular region may be coded using the same context, determined based on the region. In other examples, contexts for transform coefficients within a region may be determined based on a context neighborhood. In still other examples, a video coder may determine an offset to be applied to a context based on the region in which a transform coefficient occurs. That is, each of the regions may be associated with a particular context offset to be applied to a context.

The techniques of this disclosure may reduce bandwidth consumption, leading to savings of bits when coding syntax elements for transform coefficients. Such syntax elements may include any or all of a significant coefficient flag (which indicates whether a corresponding transform coefficient is significant, that is, non-zero), a sign of significant coefficients, an indication of whether a significant coefficient has an absolute value greater than 1, an indication of whether a significant coefficient with an absolute value greater than 1 has an absolute value greater than 2, and/or a remaining level value for coefficients having absolute values greater than 2.

Figure 1:
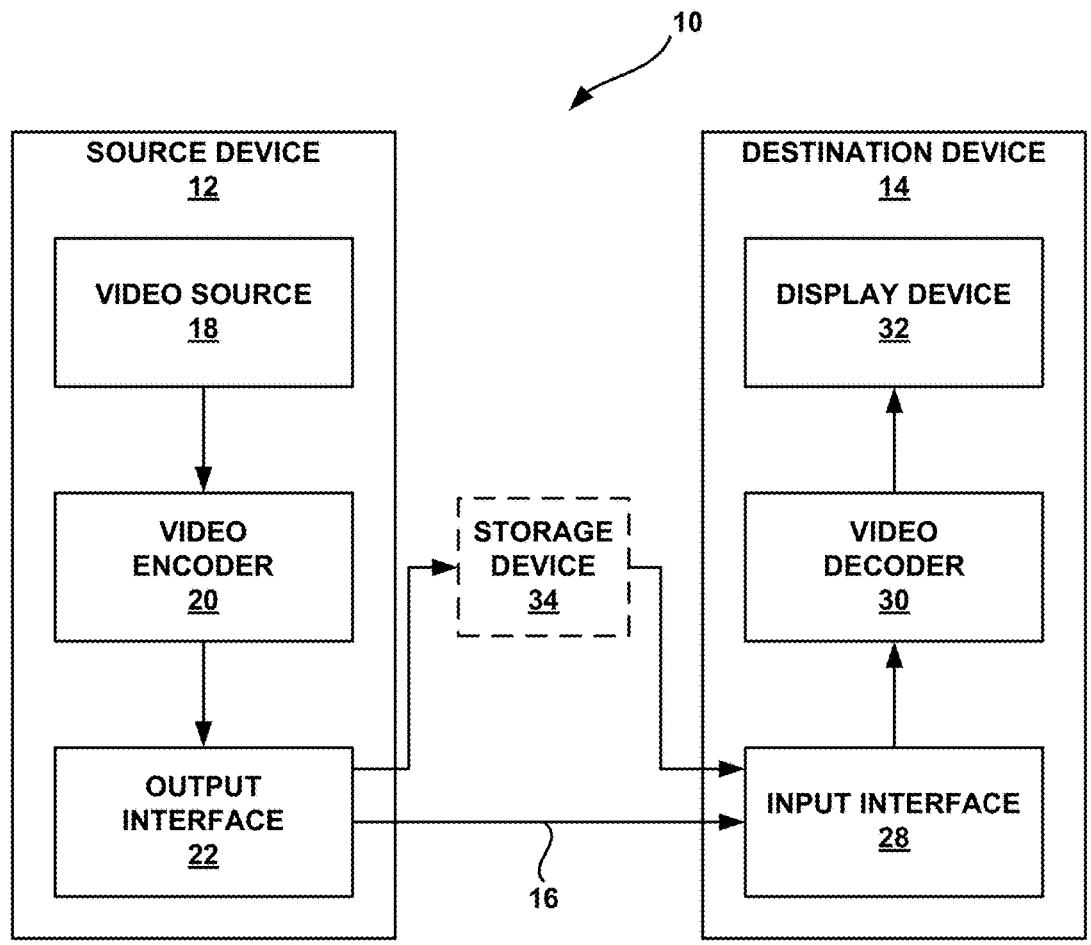
FIG. 1 is a block diagram illustrating an example video encoding and decoding system that may utilize the inter-prediction techniques described in this disclosure.

FIG. 1 is a block diagram illustrating an example video encoding and decoding system 10 that may utilize the techniques described in this disclosure. As shown in FIG. 1, system 10 includes a source device 12 that generates encoded video data to be decoded at a later time by a destination device 14. Source device 12 and destination device 14 may comprise any of a wide range of devices, including desktop computers, notebook (i.e., laptop) computers, tablet computers, set-top boxes, telephone handsets such as so-called "smart" phones, so-called "smart" pads, televisions, cameras, display devices, digital media players, video gaming consoles, video streaming device, or the like. In some cases, source device 12 and destination device 14 may be equipped for wireless communication.

Destination device 14 may receive the encoded video data to be decoded via a link 16. Link 16 may comprise any type of medium or device capable of moving the encoded video data from source device 12 to destination device 14. In one example, link 16 may comprise a communication medium to enable source device 12 to transmit encoded video data directly to destination device 14 in real-time. The encoded video data may be modulated according to a communication standard, such as a wireless communication protocol, and transmitted to destination device 14. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 12 to destination device 14.

Alternatively, encoded data may be output from output interface 22 to a storage device 34. Similarly, encoded data may be accessed from storage device 34 by input interface. Storage device 34 may include any of a variety of distributed or locally accessed data storage media such as a hard drive, Blu-ray discs, DVDs, CD-ROMs, flash memory, volatile or non-volatile memory, or any other suitable digital storage media for storing encoded video data. In a further example, storage device 34 may correspond to a file server or another intermediate storage device that may hold the encoded video generated by source device 12. Destination device 14 may access stored video data from storage device 34 via streaming or download. The file server may be any type of server capable of storing encoded video data and transmitting that encoded video data to the destination device 14. Example file servers include a web server (e.g., for a website), an FTP server, network attached storage (NAS) devices, or a local disk drive. Destination device 14 may access the encoded video data through any standard data connection, including an Internet connection. This may include a wireless channel (e.g., a Wi-Fi connection), a wired connection (e.g., DSL, cable modem, etc.), or a combination of both that is suitable for accessing encoded video data stored on a file server. The transmission of encoded video data from storage device 34 may be a streaming transmission, a download transmission, or a combination of both.

The techniques of this disclosure are not necessarily limited to wireless applications or settings. The techniques may be applied to video coding in support of any of a variety of multimedia applications, such as over-the-air television broadcasts, cable television transmissions, satellite television transmissions, streaming video transmissions, e.g., via the Internet, encoding of digital video for storage on a data storage medium, decoding of digital video stored on a data storage medium, or other applications. In some examples, system 10 may be configured to support one-way or two-way video transmission to support applications such as video streaming, video playback, video broadcasting, and/or video telephony.

In the example of FIG. 1, source device 12 includes a video source 18, video encoder 20 and an output interface 22. In some cases, output interface 22 may include a modulator/demodulator (modem) and/or a transmitter. In source device 12, video source 18 may include a source such as a video capture device, e.g., a video camera, a video archive containing previously captured video, a video feed interface to receive video from a video content provider, and/or a computer graphics system for generating computer graphics data as the source video, or a combination of such sources. As one example, if video source 18 is a video camera, source device 12 and destination device 14 may form so-called camera phones or video phones. However, the techniques described in this disclosure may be applicable to video coding in general, and may be applied to wireless and/or wired applications.

The captured, pre-captured, or computer-generated video may be encoded by video encoder 20. The encoded video data may be transmitted directly to destination device 14 via output interface 22 of source device 12. The encoded video data may also (or alternatively) be stored onto storage device 34 for later access by destination device 14 or other devices, for decoding and/or playback.

Destination device 14 includes an input interface 28, a video decoder 30, and a display device 32. In some cases, input interface 28 may include a receiver and/or a modem. Input interface 28 of destination device 14 receives the encoded video data over link 16. The encoded video data communicated over link 16, or provided on storage device 34, may include a variety of syntax elements generated by video encoder 20 for use by a video decoder, such as video decoder 30, in decoding the video data. Such syntax elements may be included with the encoded video data transmitted on a communication medium, stored on a storage medium, or stored a file server.

Display device 32 may be integrated with, or external to, destination device 14. In some examples, destination device 14 may include an integrated display device and also be configured to interface with an external display device. In other examples, destination device 14 may be a display device. In general, display device 32 displays the decoded video data to a user, and may comprise any of a variety of display devices such as a liquid crystal display (LCD), a plasma display, an organic light emitting diode (OLED) display, or another type of display device.

Video encoder 20 and video decoder 30 may operate according to a video compression standard, such as the High Efficiency Video Coding (HEVC) standard presently under development, and may conform to the HEVC Test Model (HM). Alternatively, video encoder 20 and video decoder 30 may operate according to other proprietary or industry standards, such as the ITU-T H.264 standard, alternatively referred to as MPEG-4, Part 10, Advanced Video Coding (AVC), or extensions of such standards. Extensions of standards include, for example, scalable video coding (SVC), multiview video coding (MVC), three-dimensional (3D) such as coding depth information, and the like. The techniques of this disclosure, however, are not limited to any particular coding standard or standard extension. Other examples of video compression standards include MPEG-2 and ITU-T H.263.

Although not shown in FIG. 1, in some aspects, video encoder 20 and video decoder 30 may each be integrated with an audio encoder and decoder, and may include appropriate MUX-DEMUX units, or other hardware and software, to handle encoding of both audio and video in a common data stream or separate data streams. If applicable, in some examples, MUX-DEMUX units may conform to the ITU H.223 multiplexer protocol, or other protocols such as the user datagram protocol (UDP).

Video encoder 20 and video decoder 30 each may be implemented as any of a variety of suitable encoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 20 and video decoder 30 may be included in one or more encoders or decoders, either of which may be integrated as part of a combined encoder/decoder (CODEC) in a respective device.

The JCT-VC is working on development of the HEVC standard. The HEVC standardization efforts are based on an evolving model of a video coding device referred to as the HEVC Test Model (HM). The HM presumes several additional capabilities of video coding devices relative to existing devices according to, e.g., ITU-T H.264/AVC. For example, whereas H.264 provides nine intra-prediction encoding modes, the HM may provide as many as thirty-three intra-prediction encoding modes.

In general, the working model of the HM describes that a video frame or picture may be divided into a sequence of treeblocks or largest coding units (LCU) that include both luma and chroma samples. A treeblock has a similar purpose as a macroblock of the H.264 standard. A slice includes a number of consecutive treeblocks in coding order. A video frame or picture may be partitioned into one or more slices. Each treeblock may be split into coding units (CUs) according to a quadtree. For example, a treeblock, as a root node of the quadtree, may be split into four child nodes, and each child node may in turn be a parent node and be split into another four child nodes. A final, unsplit child node, as a leaf node of the quadtree, comprises a coding node, i.e., a coded video block. Syntax data associated with a coded bitstream may define a maximum number of times a treeblock may be split, and may also define a minimum size of the coding nodes.

A CU includes a coding node and prediction units (PUs) and transform units (TUs) associated with the coding node. A size of the CU corresponds to a size of the coding node and must be square in shape. The size of the CU may range from 8×8 pixels up to the size of the treeblock with a maximum of 64×64 pixels or greater. Each CU may contain one or more PUs and one or more TUs. Syntax data associated with a CU may describe, for example, partitioning of the CU into one or more PUs. Partitioning modes may differ between whether the CU is skip or direct mode encoded, intra-prediction mode encoded, or inter-prediction mode encoded. PUs may be partitioned to be non-square in shape. Syntax data associated with a CU may also describe, for example, partitioning of the CU into one or more TUs according to a quadtree. A TU can be square or non-square in shape.

The HEVC standard allows for transformations according to TUs, which may be different for different CUs. The TUs are typically sized based on the size of PUs within a given CU defined for a partitioned LCU, although this may not always be the case. The TUs are typically the same size or smaller than the PUs. In some examples, residual samples corresponding to a CU may be subdivided into smaller units using a quadtree structure known as "residual quad tree" (RQT). The leaf nodes of the RQT may be referred to as transform units (TUs). Pixel difference values associated with the TUs may be transformed to produce transform coefficients, which may be quantized.

In general, a PU includes data related to the prediction process. For example, when the PU is intra-mode encoded, the PU may include data describing an intra-prediction mode for the PU. As another example, when the PU is inter-mode encoded, the PU may include data defining a motion vector for the PU. The data defining the motion vector for a PU may describe, for example, a horizontal component of the motion vector, a vertical component of the motion vector, a resolution for the motion vector (e.g., one-quarter pixel precision or one-eighth pixel precision), a reference picture to which the motion vector points, and/or a reference picture list for the motion vector.

In general, a TU is used for the transform and quantization processes. A given CU having one or more PUs may also include one or more TUs. Following prediction, video encoder 20 may calculate residual values corresponding to the PU. The residual values comprise pixel difference values that may be transformed into transform coefficients, quantized, and scanned using the TUs to produce serialized transform coefficients for entropy coding. This disclosure typically uses the term "video block" to refer to a coding node of a CU. In some specific cases, this disclosure may also use the term "video block" to refer to a treeblock, i.e., LCU, or a CU, which includes a coding node and PUs and TUs.

A video sequence typically includes a series of video frames or pictures. A group of pictures (GOP) generally comprises a series of one or more of the video pictures. A GOP may include syntax data in a header of the GOP, a header of one or more of the pictures, or elsewhere, that describes a number of pictures included in the GOP. Each slice of a picture may include slice syntax data that describes an encoding mode for the respective slice. Video encoder 20 typically operates on video blocks within individual video slices in order to encode the video data. A video block may correspond to a coding node within a CU. The video blocks may have fixed or varying sizes, and may differ in size according to a specified coding standard.

As an example, the HM supports prediction in various PU sizes. Assuming that the size of a particular CU is 2N×2N, the HM supports intra-prediction in PU sizes of 2N×2N or N×N, and inter-prediction in symmetric PU sizes of 2N×2N, 2N×N, N×2N, or N×N. The HM also supports asymmetric partitioning for inter-prediction in PU sizes of 2N×nU, 2N×nD, nL×2N, and nR×2N. In asymmetric partitioning, one direction of a CU is not partitioned, while the other direction is partitioned into 25% and 75%. The portion of the CU corresponding to the 25% partition is indicated by an "n" followed by an indication of "Up", "Down," "Left," or "Right." Thus, for example, "2N×nU" refers to a 2N×2N CU that is partitioned horizontally with a 2N×0.5N PU on top and a 2N×1.5N PU on bottom.

In this disclosure, "N×N" and "N by N" may be used interchangeably to refer to the pixel dimensions of a video block in terms of vertical and horizontal dimensions, e.g., 16×16 pixels or 16 by 16 pixels. In general, a 16×16 block will have 16 pixels in a vertical direction (y=16) and 16 pixels in a horizontal direction (x=16). Likewise, an N×N block generally has N pixels in a vertical direction and N pixels in a horizontal direction, where N represents a non-negative integer value. The pixels in a block may be arranged in rows and columns. Moreover, blocks need not necessarily have the same number of pixels in the horizontal direction as in the vertical direction. For example, blocks may comprise N×M pixels, where M is not necessarily equal to N.

Following intra-predictive or inter-predictive coding using the PUs of a CU, video encoder 20 may calculate residual data for the TUs of the CU. The PUs may comprise pixel data in the spatial domain (also referred to as the pixel domain) and the TUs may comprise coefficients in the transform domain following application of a transform, e.g., a discrete cosine transform (DCT), an integer transform, a wavelet transform, or a conceptually similar transform to residual video data. The residual data may correspond to pixel differences between pixels of the unencoded picture and prediction values corresponding to the PUs. Video encoder 20 may form the TUs including the residual data for the CU, and then transform the TUs to produce transform coefficients for the CU.

Following any transforms to produce transform coefficients, video encoder 20 may perform quantization of the transform coefficients. Quantization generally refers to a process in which transform coefficients are quantized to possibly reduce the amount of data used to represent the coefficients, providing further compression. The quantization process may reduce the bit depth associated with some or all of the coefficients. For example, an n-bit value may be rounded down to an m-bit value during quantization, where n is greater than m.

In some examples, video encoder 20 and video decoder 30 may utilize a predefined scan order to scan the quantized transform coefficients to produce a serialized vector that can be entropy encoded. In other examples, video encoder 20 and video decoder 30 may perform an adaptive scan. After scanning the quantized transform coefficients to form a one-dimensional vector, or during the scan, video encoder 20 may entropy encode the one-dimensional vector, e.g., according to context adaptive variable length coding (CAVLC), context adaptive binary arithmetic coding (CABAC), syntax-based context-adaptive binary arithmetic coding (SBAC), Probability Interval Partitioning Entropy (PIPE) coding or another entropy encoding methodology. Video decoder 30 may entropy decode the coefficients, perform an inverse quantization process and an inverse transform process to reproduce residual data, and combine the residual data with predictive data to produce decoded video data. Video encoder 20 may also entropy encode syntax elements associated with the encoded video data for use by video decoder 30 in decoding the video data.

To perform CABAC, video encoder 20 and video decoder 30 may assign a context within a context model to a symbol to be coded. The context may relate to, for example, whether neighboring values of the symbol are non-zero or not. In accordance with the techniques of this disclosure, video encoder 20 and/or video decoder 30 may be configured to determine context for entropy coding (e.g., entropy encoding or entropy decoding) a transform coefficient based on a region of a video block in which the transform coefficient occurs.

Video encoder 20 and video decoder 30 may be configured with definitions of various regions for video blocks (e.g., transform units). For example, video encoder 20 and video decoder 30 may be configured with definitions of regions for various sizes of video blocks. In some examples, video encoder 20 may determine a method by which to divide a video block into regions and code data representative of how the block is to be divided. Each of the regions may be associated with a respective value and/or technique for determining context for transform coefficients occurring within the respective region.

For example, a particular region of a video block may be associated with a neighborhood-based context determination scheme, while another region of the video block may be associated with a position-based context determination scheme. As another example, a region of a video block may be associated with an offset to be applied to a context determined for transform coefficients located in that region. Different regions of the same video block may be associated with different offset values and/or different techniques for calculating context.

As one example, a video block may include two different regions: a first region including one or more sub-blocks (e.g., 4×4 transform coefficient sub-blocks) in an upper-left corner of the video block, and a second region including other sub-blocks of the video block that are not included in the first region. More specifically, video encoder 20 and video decoder 30 may determine an x- and y-coordinate of a sub-block and determine whether the sub-block is in the first region or the second region by comparing the sum of x and y to a threshold value. If the sum of x and y is less than the threshold, video encoder 20 and video decoder 30 may determine that the sub-block is in the first region, and otherwise, video encoder 20 and video decoder 30 may determine that the sub-block is in the second region. Video encoder 20 and video decoder 30 may determine context for coefficients of a video block based on whether the coefficients are in a sub-block of the first region or a sub-block of the second region.

For example, in some regions, the context may be a fixed context, in which video encoder 20 and video decoder 30 codes transform coefficients in such regions using the fixed context. That is, video encoder 20 and video decoder 30 may apply the same context to all transform coefficients in the region. Alternatively, each of the sub-blocks in the region may be associated with the same method of determining context (e.g., the fixed context method), but different sub-blocks in the region may have different fixed contexts. Video encoder 20 and video decoder 30 may determine a fixed context for a sub-block based on the position of the sub-block in the region. As still another example, fixed contexts may be assigned to individual transform coefficient positions within the region. That is, video encoder 20 and video decoder 30 may determine context for coding a transform coefficient within the region based on a position of the transform coefficient in the video block, the sub-block, and/or the region.

As another example, in some regions, a context model may be defined according to neighboring sub-blocks. For example, video encoder 20 and video decoder 30 may be configured with sets of contexts for each sub-block within a particular region. That is, each sub-block in the region may be associated with a respective set of contexts. Video encoder 20 and video decoder 30 may select an appropriate context from the set of contexts for each transform coefficient in the respective sub-block. The set of contexts for one sub-block may be different from the set of contexts for another sub-block.

As yet another example, individual flags for each sub-block in a region may be coded representing whether there are any significant (i.e., non-zero) coefficients in the corresponding sub-block. These flags may be referred to as coded sub-block flags. Such flags may be used for selecting context for coding transform coefficients in the sub-blocks. For example, video encoder 20 and video decoder 30 may determine context for coding transform coefficients in a sub-block based on the values of the flags of one or more neighboring sub-blocks. For example, the flags may have binary values of either 0 or 1, and video encoder 20 and video decoder 30 may determine the context for coding transform coefficients in a current sub-block based on the sum of the flag values for a right-neighboring sub-block and a below-neighboring sub-block (also referred to as a bottom-neighboring sub-block). Other formulas may also be used for calculating the context for a sub-block.

Video encoder 20 and video decoder 30 may be configured to implement any or all of the techniques of this disclosure, alone or in any combination. One example combination of these techniques is that video encoder 20 and video decoder 30 may be configured to divide a transform unit into sub-blocks (e.g., 4×4 pixel sub-blocks), and then determine context for coding data of a particular transform coefficient of a sub-block based on both a position of the transform coefficient in the sub-block and based on coded block flags for one or more neighboring sub-blocks, e.g., a left-neighboring sub-block and a bottom-neighboring sub-block.

Video encoder 20 and video decoder 30 may be configured to code one or more syntax elements representative of transform coefficients using contexts determined in these various examples. Transform coefficients may include various types of syntax elements. For example, a transform coefficient may include a significant coefficient flag (significant_coeff_flag) indicative of whether the transform coefficient has a non-zero value (i.e., is significant). If the transform coefficient is significant, the transform coefficient may include a sign value (e.g., coeff_sign_flag) indicating whether the value of the transform coefficient is greater than or less than 0 and a value indicative of whether the absolute value of the transform coefficient is greater than 1 (e.g., coeff_abs_level_greater1_flag). If the transform coefficient has an absolute value greater than 1, the transform coefficient may include a value indicative of whether the transform coefficient has an absolute value greater than 2 (e.g., coeff_abs_level_greater2_flag). If the transform coefficient has an absolute value greater than 2, the transform coefficient may include a value indicative of the absolute value of the transform coefficient minus two (e.g., coeff_abs_level_remaining).

A CABAC coder of video encoder 20 and video decoder 30 may code any or all of these values using contexts determined in accordance with the techniques of this disclosure. In addition, or in the alternative, video encoder 20 and video decoder 30 may code data indicative of a position of a last significant coefficient (e.g., last_significant_coeff_x_prefix, last_significant_coeff_x_suffix, last_significant_coeff_y_prefix, and last_significant_coeff_y_suffix) using context determined in accordance with the techniques of this disclosure.

Video encoder 20 and video decoder 30 may be configured to perform any one or more of the techniques described in this disclosure, alone or in any combination. Various techniques for determining a context for coding a transform coefficient of a video block based on a region of the video block in which the transform coefficient occurs and entropy coding the transform coefficient using the determined context are described below. Examples of such techniques are described with respect to FIGS. 9-14 below. In general, coding the transform coefficient using the determined context includes coding one or more syntax elements of the transform coefficient using the determined context. Determining the context generally includes determining a region in which the transform coefficient occurs and determining the context based on the region. For example, the region may be associated with a particular context or set of contexts, and/or associated with one or more techniques for determining the context.

Figure 2:
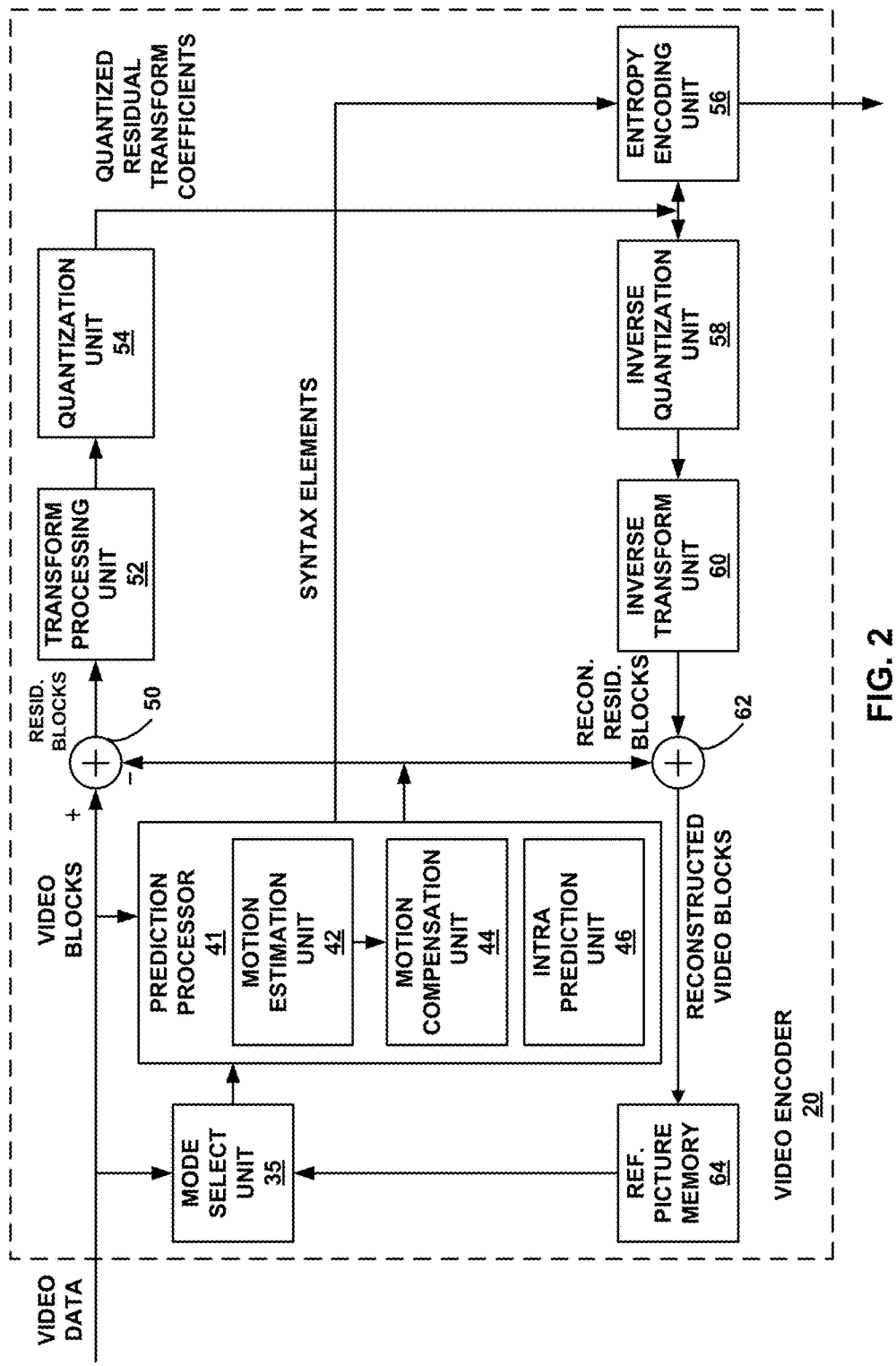
FIG. 2 is a block diagram illustrating an example video encoder that may implement the inter-prediction techniques described in this disclosure.

FIG. 2 is a block diagram illustrating an example video encoder 20 that may implement the inter-prediction techniques described in this disclosure. Video encoder 20 may perform intra- and inter-coding of video blocks within video slices. Intra-coding relies on spatial prediction to reduce or remove spatial redundancy in video within a given video frame or picture. Inter-coding relies on temporal prediction to reduce or remove temporal redundancy in video within adjacent frames or pictures of a video sequence. Intra-mode (I mode) may refer to any of several spatial based compression modes. Inter-modes, such as uni-directional prediction (P mode) or bi-prediction (B mode), may refer to any of several temporal-based compression modes.

In the example of FIG. 2, video encoder 20 includes a mode select unit 35, prediction processor 41, reference picture memory 64, summer 50, transform processing unit 52, quantization unit 54, and entropy encoding unit 56. Prediction processor 41 includes motion estimation unit 42, motion compensation unit 44, and intra prediction unit 46. For video block reconstruction, video encoder 20 also includes inverse quantization unit 58, inverse transform unit 60, and summer 62. A deblocking filter (not shown in FIG. 2) may also be included to filter block boundaries to remove blockiness artifacts from reconstructed video. If desired, the deblocking filter would typically filter the output of summer 62. Additional loop filters (in loop or post loop) may also be used in addition to the deblocking filter.

As shown in FIG. 2, video encoder 20 receives video data, and mode select unit 35 partitions the data into video blocks. This partitioning may also include partitioning into slices, tiles, or other larger units, as wells as video block partitioning, e.g., according to a quadtree structure of LCUs and CUs. Video encoder 20 generally illustrates the components that encode video blocks within a video slice to be encoded. The slice may be divided into multiple video blocks (and possibly into sets of video blocks referred to as tiles). Prediction processor 41 may select one of a plurality of possible coding modes, such as one of a plurality of intra coding modes or one of a plurality of inter coding modes, for the current video block based on error results (e.g., coding rate and the level of distortion). Prediction processor 41 may provide the resulting intra- or inter-coded block to summer 50 to generate residual block data and to summer 62 to reconstruct the encoded block for use as a reference picture.

Intra prediction unit 46 within prediction processor 41 may perform intra-predictive coding of the current video block relative to one or more neighboring blocks in the same frame or slice as the current block to be coded to provide spatial compression. Motion estimation unit 42 and motion compensation unit 44 within prediction processor 41 perform inter-predictive coding of the current video block relative to one or more predictive blocks in one or more reference pictures to provide temporal compression.

Motion estimation unit 42 may be configured to determine the inter-prediction mode for a video slice according to a predetermined pattern for a video sequence. The predetermined pattern may designate video slices in the sequence as P slices, B slices or GPB slices. Motion estimation unit 42 and motion compensation unit 44 may be highly integrated, but are illustrated separately for conceptual purposes. Motion estimation, performed by motion estimation unit 42, is the process of generating motion vectors, which estimate motion for video blocks. A motion vector, for example, may indicate the displacement of a PU of a video block within a current video frame or picture relative to a predictive block within a reference picture.

A predictive block is a block that is found to closely match the PU of the video block to be coded in terms of pixel difference, which may be determined by sum of absolute difference (SAD), sum of square difference (SSD), or other difference metrics. In some examples, video encoder 20 may calculate values for sub-integer pixel positions of reference pictures stored in reference picture memory 64. For example, video encoder 20 may interpolate values of one-quarter pixel positions, one-eighth pixel positions, or other fractional pixel positions of the reference picture. Therefore, motion estimation unit 42 may perform a motion search relative to the full pixel positions and fractional pixel positions and output a motion vector with fractional pixel precision.

Motion estimation unit 42 calculates a motion vector for a PU of a video block in an inter-coded slice by comparing the position of the PU to the position of a predictive block of a reference picture. The reference picture may be selected from a first reference picture list (List 0) or a second reference picture list (List 1), each of which identify one or more reference pictures stored in reference picture memory 64. Motion estimation unit 42 sends the calculated motion vector to entropy encoding unit 56 and motion compensation unit 44.

Motion compensation, performed by motion compensation unit 44, may involve fetching or generating the predictive block based on the motion vector determined by motion estimation, possibly performing interpolations to sub-pixel precision. Upon receiving the motion vector for the PU of the current video block, motion compensation unit 44 may locate the predictive block to which the motion vector points in one of the reference picture lists. Motion compensation unit 44 may also generate syntax elements associated with the video blocks and the video slice for use by video decoder 30 in decoding the video blocks of the video slice.

Intra prediction unit 46 may intra-predict a current block, as an alternative to the inter-prediction performed by motion estimation unit 42 and motion compensation unit 44, as described above. In particular, intra prediction unit 46 may determine an intra-prediction mode to use to encode a current block. In some examples, intra prediction unit 46 may encode a current block using various intra-prediction modes, e.g., during separate encoding passes, and intra prediction unit 46 (or mode select unit 35, in some examples) may select an appropriate intra-prediction mode to use from the tested modes. For example, intra prediction unit 46 may calculate rate-distortion values using a rate-distortion analysis for the various tested intra-prediction modes, and select the intra-prediction mode having the best rate-distortion characteristics among the tested modes. Rate-distortion analysis generally determines an amount of distortion (or error) between an encoded block and an original, unencoded block that was encoded to produce the encoded block, as well as a bit rate (that is, a number of bits) used to produce the encoded block. Intra prediction unit 46 may calculate ratios from the distortions and rates for the various encoded blocks to determine which intra-prediction mode exhibits the best rate-distortion value for the block.

In any case, after selecting an intra-prediction mode for a block, intra prediction unit 46 may provide information indicative of the selected intra-prediction mode for the block to entropy encoding unit 56. Entropy encoding unit 56 may encode the information indicating the selected intra-prediction mode in accordance with the techniques of this disclosure. Video encoder 20 may include in the transmitted bitstream configuration data, which may include a plurality of intra-prediction mode index tables and a plurality of modified intra-prediction mode index tables (also referred to as codeword mapping tables), definitions of encoding contexts for various blocks, and indications of a most probable intra-prediction mode, an intra-prediction mode index table, and a modified intra-prediction mode index table to use for each of the contexts.

After prediction processor 41 generates the predictive block for the current video block via either inter-prediction or intra-prediction, video encoder 20 forms a residual video block by subtracting the predictive block from the current video block. Summer 50 represents the unit that performs this calculation. The residual video data in the residual block may be included in one or more TUs and applied to transform processing unit 52. Transform processing unit 52 generally converts the residual video data from a pixel domain to a transform domain, such as a frequency domain. Transform processing unit 52 may transform the residual video data into residual transform coefficients using a transform, such as a discrete cosine transform (DCT) or a conceptually similar transform. Alternatively, transform processing unit 52 may apply a 2-dimensional (2-D) transform (in both the horizontal and vertical direction) to the residual data in the TUs.

Transform processing unit 52 may send the resulting transform coefficients to quantization unit 54. Quantization unit 54 quantizes the transform coefficients to further reduce the bit rate. The quantization process may reduce the bit depth associated with some or all of the coefficients. The degree of quantization may be modified by adjusting a quantization parameter.

Following quantization, entropy encoding unit 56 entropy encodes the quantized transform coefficients. For example, entropy encoding unit 56 may perform context adaptive variable length coding (CAVLC), context adaptive binary arithmetic coding (CABAC), syntax-based context-adaptive binary arithmetic coding (SBAC), probability interval partitioning entropy (PIPE) coding or another entropy encoding methodology or technique. Such entropy encoding generally includes scanning the quantized transform coefficients (generally referred to herein simply as "transform coefficients" for brevity) one or more times, and entropy coding syntax elements for the transform coefficients during each scan, such as syntax elements indicating whether corresponding transform coefficients are significant, have an absolute value greater than 1 or 2, the absolute value (or a portion thereof, e.g., a portion greater than 2) and sign of significant coefficients.

In accordance with the techniques of this disclosure, entropy encoding unit 56 may determine a context for coding (that is, entropy encoding) a transform coefficient of a video block (e.g., a transform unit) based on a region of the video block in which the transform coefficient occurs. For example, during the scan, entropy encoding unit 56 may determine a position of the transform coefficient in the video block, and determine in which region the position occurs. In addition, entropy encoding unit 56 may include configuration data defining regions for a video block.

For example, entropy encoding unit 56 may be configured with a threshold value. In this example, entropy encoding unit 56 may determine whether x- and y-coordinates defining the position of the transform coefficient have a sum (that is, x+y) that is greater than the threshold value. A first region, in this example, corresponds to transform coefficients for which the sum of the x- and y-coordinate values is less than the threshold value, and a second region corresponds to transform coefficients for which the sum of the x- and y-coordinate values is greater than or equal to the threshold value. Alternatively, multiple threshold values may be used to define multiple regions. An example of regions defined in this manner is shown in FIG. 9B, which is described in greater detail below.

As another example, entropy encoding unit 56 may be configured to determine the position of a sub-block, including the transform coefficient, in the video block. A sub-block may correspond to a 4×4 transform coefficient sub-block. That is, a video block may include a plurality of non-overlapping sub-blocks, each having the same size, e.g., 4×4 transform coefficients. To determine a region for a sub-block, entropy encoding unit 56 may compare the sum of an x- and y-coordinate of the sub-block (e.g., a particular transform coefficient of the sub-block, such as an upper-left transform coefficient of the sub-block) to the threshold value. Whether the sum of the x- and y-coordinates is less than the threshold value or not may be indicative of whether the transform coefficients of the sub-block are included in a first region or a second region.

For example, let Cij represent the position of a sub-block having an upper-left transform coefficient at position (i, j), where x=i and y=j. Further, let T define the threshold value. Entropy encoding unit 56 may determine a region in which transform coefficients of the sub-block occur using the following pseudocode:

$(i+j<T)$?region1:region2.

In this example, when i+j is less than T (that is, the sum of the x- and y-coordinates of the sub-block is less than the threshold value), entropy encoding unit 56 determines that all transform coefficients of the sub-block occur in region 1, whereas when i+j is greater than or equal to T (that is, the sum of the x- and y-coordinates of the sub-block is greater than or equal to the threshold value), entropy encoding unit 56 determines that all transform coefficients of the sub-block occur in region 2. These and other examples of regions are described in greater detail below with respect to FIGS. 9-14.

Entropy encoding unit 56 may be configured to determine contexts based on regions in various ways. For example, entropy encoding unit 56 may determine context for coding a transform coefficient, based on the region in which the transform coefficient occurs, using the location of the transform coefficient in the video block or the position of the 4×4 sub-block in which the transform coefficient occurs.

Alternatively, a context model may be defined according to neighboring 4×4 sub-blocks. For example, entropy encoding unit 56 may assign to each 4×4 sub-block a respective set of available contexts, and select one of the contexts for the current transform coefficient to be coded in the sub-block, e.g., based on a position of the transform coefficient in the sub-block. The sets of contexts may be assigned to respective sub-blocks, such that each sub-block may have a different set of available contexts. As still another example, entropy encoding unit 56 may calculate a context as ctx=Right4×4SubBlockFlag+Bottom4×4SubBlockFlag. In this case, Right4×4SubBlockFlag represents a coded sub-block flag for a right-neighboring sub-block, while Bottom4×4SubBlockFlag represents a coded sub-block flag for a bottom-neighboring coded sub-block flag.

In some examples, entropy encoding unit 56 may apply an offset to the determined context for entropy encoding a transform coefficient, and may further determine the offset to apply based on the region in which the transform coefficient occurs. That is, entropy encoding unit 56 may calculate a base context in the same general manner for coefficients of two or more regions, but different regions may have different corresponding offset values. Thus, entropy encoding unit 56 may apply the offset to the calculated context value based on the offset to which the region is mapped (that is, the offset with which the region is associated).

Entropy encoding unit 56 may determine whether a transform coefficient is a DC (direct current) transform coefficient (typically presented in the upper-left corner of the transform block), and select the context for coding the transform coefficient based on the region in which the transform coefficient occurs as well as whether the transform coefficient is the DC transform coefficient or not. For example, entropy encoding unit 56 may determine contexts for transform coefficients using shared contexts for dedicated positions. That is, the shared context may comprise the same context that is applied to all transform coefficients occurring at a particular position, e.g., an upper-left corner of a sub-block. Thus, the shared context may further include an indication of a particular context to be applied when coding a DC transform coefficient, as opposed to non-DC transform coefficients occurring at the upper-left position of other sub-blocks.

Additionally or alternatively, shared context may comprise shared contexts among different sizes of blocks for transform coefficients occurring at particular positions of the blocks. For example, entropy encoding unit 56 may be configured to apply the same context when coding DC transform coefficients of video blocks (e.g., TUs) of any size, e.g., 4×4, 8×8, 16×16, or the like. That is, entropy encoding unit 56 may include data that maps the DC transform coefficient, for blocks of any size, to the same context data for coding the DC transform coefficient. In other words, entropy encoding unit 56 may be configured to code the DC transform coefficient using a context determined for the DC transform coefficient, without regard for a size of the current video block being coded. Typically, the DC transform coefficient is the upper-left coefficient of the video block.

Following the entropy encoding by entropy encoding unit 56, the encoded bitstream may be transmitted to video decoder 30, or archived for later transmission or retrieval by video decoder 30. Entropy encoding unit 56 may also entropy encode motion vectors, intra-mode indications, and the other syntax elements for the current video slice being coded.

Inverse quantization unit 58 and inverse transform unit 60 apply inverse quantization and inverse transformation, respectively, to reconstruct the residual block in the pixel domain for later use as a reference block of a reference picture. Motion compensation unit 44 may calculate a reference block by adding the residual block to a predictive block of one of the reference pictures within one of the reference picture lists. Motion compensation unit 44 may also apply one or more interpolation filters to the reconstructed residual block to calculate sub-integer pixel values for use in motion estimation. Summer 62 adds the reconstructed residual block to the motion compensated prediction block produced by motion compensation unit 44 to produce a reference block for storage in reference picture memory 64. The reference block may be used by motion estimation unit 42 and motion compensation unit 44 as a reference block to inter-predict a block in a subsequent video frame or picture.

In this manner, video encoder 20 represents an example of a video coder configured to determine a context for coding a transform coefficient of a video block based on a region of the video block in which the transform coefficient occurs, and entropy code the transform coefficient using the determined context. The region may comprise one of a first region comprising one or more upper-left 4×4 sub-blocks of transform coefficients of the video block and a second region comprising transform coefficients of the video block outside the first region.

Figure 3:
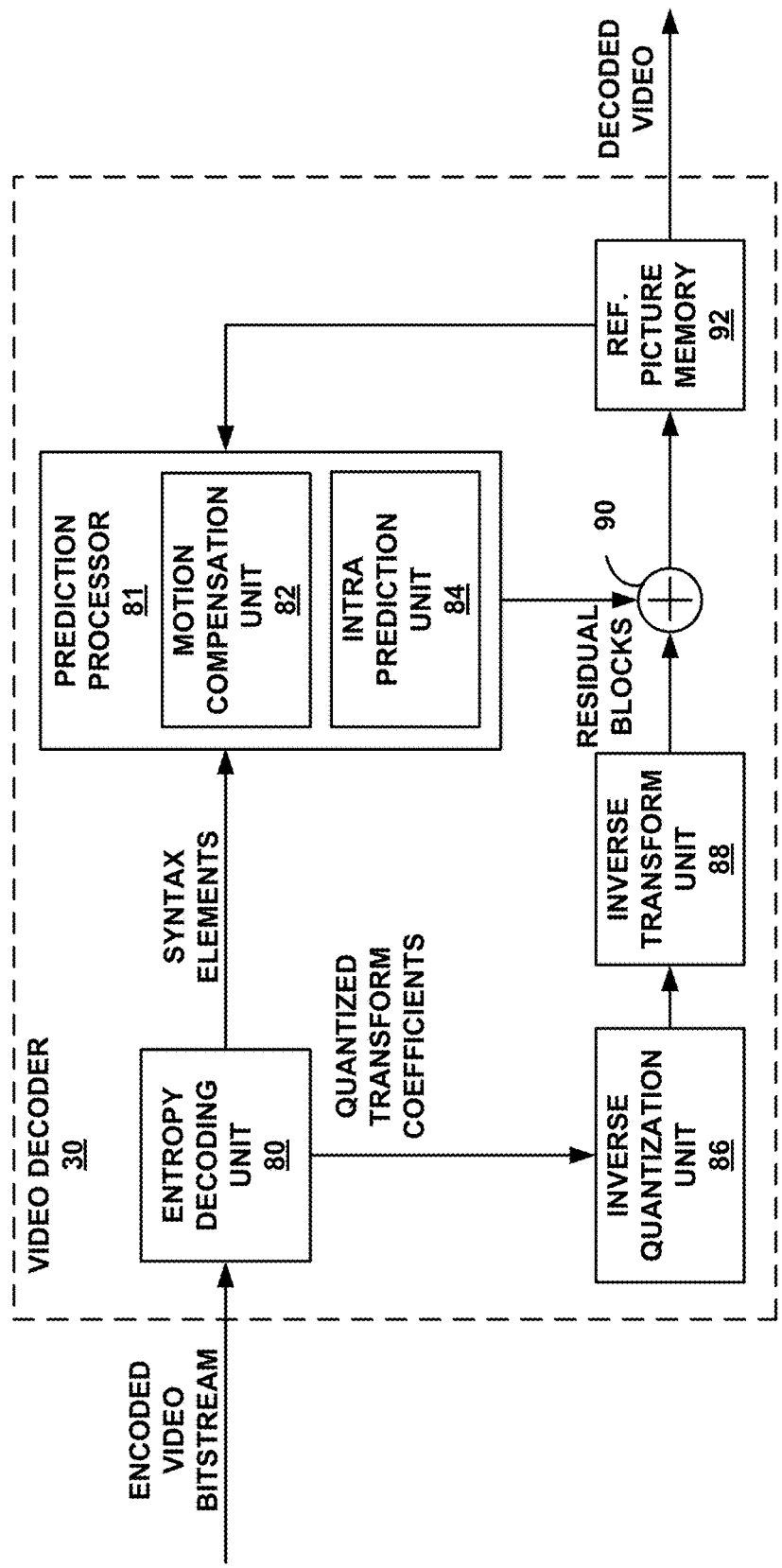
FIG. 3 is a block diagram illustrating an example video decoder that may implement the inter-prediction techniques described in this disclosure.

FIG. 3 is a block diagram illustrating an example video decoder 30 that may implement the inter-prediction techniques described in this disclosure. In the example of FIG. 3, video decoder 30 includes an entropy decoding unit 80, prediction processor 81, inverse quantization unit 86, inverse transformation unit 88, summer 90, and reference picture memory 92. Prediction processor 81 includes motion compensation unit 82 and intra prediction unit 84. Video decoder 30 may, in some examples, perform a decoding pass generally reciprocal to the encoding pass described with respect to video encoder 20 from FIG. 2.

During the decoding process, video decoder 30 receives an encoded video bitstream that represents video blocks of an encoded video slice and associated syntax elements from video encoder 20. Entropy decoding unit 80 of video decoder 30 entropy decodes the bitstream to generate quantized coefficients, motion vectors, and other syntax elements. Entropy decoding unit 80 forwards the motion vectors, intra-mode indications, and other prediction-related syntax elements to prediction processor 81. Entropy decoding unit 80 forwards quantized coefficients, in the form of a block (e.g., a TU) to inverse quantization unit 86. Video decoder 30 may receive the syntax elements at the video slice level and/or the video block level.

In particular, in accordance with the techniques of this disclosure, entropy decoding unit 80 may determine context for entropy decoding transform coefficients based on a region of a block in which the transform coefficients occur. Specifically, entropy decoding unit 80 may determine the context based on a region of the block in which the transform coefficient will occur once the transform coefficient is positioned within the block. Entropy decoding unit 80 may be configured to determine the regions as explained with respect to FIGS. 9-14 below, or other such regions. For example, as shown in FIG. 9A, entropy decoding unit 80 may be configured to determine whether a transform coefficient will occur in a first region including one or more sub-blocks in an upper-left corner of the block, or a second region including sub-blocks outside the first region, and determine the context based on whether the transform coefficient will occur in the first region or the second region.

Likewise, entropy decoding unit 80 may determine the context based on the region, in that entropy decoding unit 80 may be configured with one or more various techniques for calculating or determining the context associated with coefficients in each region. That is, each region may be associated with one or more techniques for calculating or determining context. For example, a region may be associated with a context that is shared among one or more transform coefficients. As another example, a region may be associated with contexts that are shared among sub-blocks of the region. As still another example, a region may be associated with an offset value to be applied to a context value calculated for a transform coefficient in the region. Entropy decoding unit 80 may be configured to determine the context for decoding a transform coefficient using these or other techniques as described herein, based on the region in which the transform coefficient occurs. Entropy decoding unit 80 may then entropy decode the transform coefficient using the determined context.

Additionally or alternatively, shared context may comprise shared contexts among different sizes of blocks for transform coefficients occurring at particular positions of the blocks. For example, entropy decoding unit 80 may be configured to apply the same context when coding DC transform coefficients of video blocks (e.g., TUs) of any size, e.g., 4×4, 8×8, 16×16, or the like. That is, entropy decoding unit 80 may include data that maps the DC transform coefficient, for blocks of any size, to the same context data for coding the DC transform coefficient. In other words, entropy decoding unit 80 may be configured to code the DC transform coefficient using a context determined for the DC transform coefficient, without regard for a size of the current video block being coded. Typically, the DC transform coefficient is the upper-left coefficient of the video block.

When the video slice is coded as an intra-coded (I) slice, intra prediction unit 84 of prediction processor 81 may generate prediction data for a video block of the current video slice based on a signaled intra prediction mode and data from previously decoded blocks of the current frame or picture. When the video frame is coded as an inter-coded (i.e., B, P or GPB) slice, motion compensation unit 82 of prediction processor 81 produces predictive blocks for a video block of the current video slice based on the motion vectors and other syntax elements received from entropy decoding unit 80. The predictive blocks may be produced from one of the reference pictures within one of the reference picture lists. Video decoder 30 may construct the reference frame lists, List 0 and List 1, using default construction techniques based on reference pictures stored in reference picture memory 92.

Motion compensation unit 82 determines prediction information for a video block of the current video slice by parsing the motion vectors and other syntax elements, and uses the prediction information to produce the predictive blocks for the current video block being decoded. For example, motion compensation unit 82 uses some of the received syntax elements to determine a prediction mode (e.g., intra- or inter-prediction) used to code the video blocks of the video slice, an inter-prediction slice type (e.g., B slice, P slice, or GPB slice), construction information for one or more of the reference picture lists for the slice, motion vectors for each inter-encoded video block of the slice, inter-prediction status for each inter-coded video block of the slice, and other information to decode the video blocks in the current video slice.

Motion compensation unit 82 may also perform interpolation based on interpolation filters. Motion compensation unit 82 may use interpolation filters as used by video encoder 20 during encoding of the video blocks to calculate interpolated values for sub-integer pixels of reference blocks. In this case, motion compensation unit 82 may determine the interpolation filters used by video encoder 20 from the received syntax elements and use the interpolation filters to produce predictive blocks.

Inverse quantization unit 86 inverse quantizes, i.e., de-quantizes, the quantized transform coefficients provided in the bitstream and decoded by entropy decoding unit 80. The inverse quantization process may include use of a quantization parameter calculated by video encoder 20 for each video block in the video slice to determine a degree of quantization and, likewise, a degree of inverse quantization that should be applied. Inverse transform unit 88 applies an inverse transform, e.g., an inverse DCT, an inverse integer transform, or a conceptually similar inverse transform process, to the transform coefficients in order to produce residual blocks in the pixel domain.

In some cases, inverse transform unit 88 may apply a two-dimensional (2-D) inverse transform (in both the horizontal and vertical direction) to the coefficients. According to the techniques of this disclosure, inverse transform unit 88 may instead apply a horizontal one-dimensional (1-D) inverse transform, a vertical 1-D inverse transform, or no transform to the residual data in each of the TUs. The type of transform applied to the residual data at video encoder 20 may be signaled to video decoder 30 to apply an appropriate type of inverse transform to the transform coefficients.

After motion compensation unit 82 generates the predictive block for the current video block based on the motion vectors and other syntax elements, video decoder 30 forms a decoded video block by summing the residual blocks from inverse transform unit 88 with the corresponding predictive blocks generated by motion compensation unit 82. Summer 90 represents the component or components that perform this summation operation. If desired, a deblocking filter may also be applied to filter the decoded blocks in order to remove blockiness artifacts. Other loop filters (either in the coding loop or after the coding loop) may also be used to smooth pixel transitions, or otherwise improve the video quality. The decoded video blocks in a given frame or picture are then stored in reference picture memory 92, which stores reference pictures used for subsequent motion compensation. Reference picture memory 92 also stores decoded video for later presentation on a display device, such as display device 32 of FIG. 1.

In this manner, video decoder 30 represents an example of a video coder configured to determine a context for coding a transform coefficient of a video block based on a region of the video block in which the transform coefficient occurs, and entropy code the transform coefficient using the determined context. The region may comprise one of a first region comprising one or more upper-left 4×4 sub-blocks of transform coefficients of the video block and a second region comprising transform coefficients of the video block outside the first region.

Figure 4:
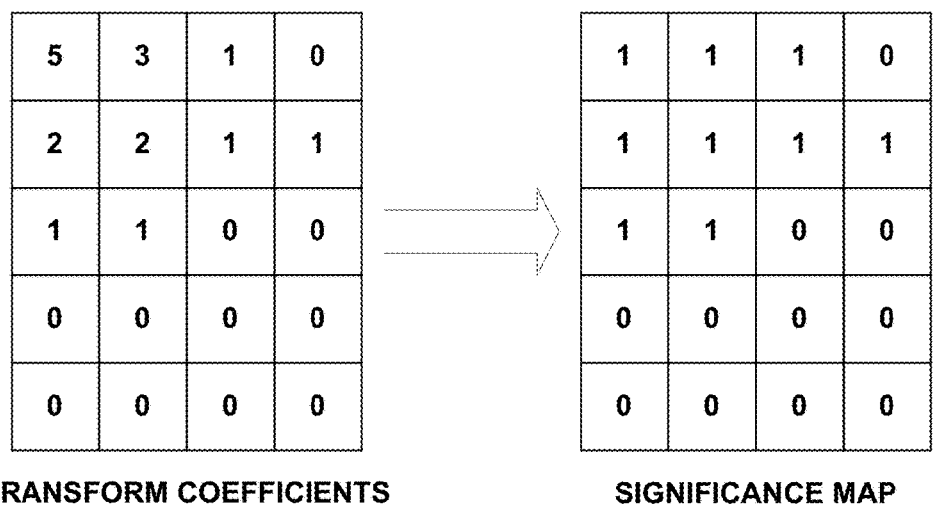
FIG. 4 is a conceptual diagram that illustrates a relation between transform coefficients in a video block and a significance map associated with the video block.

FIG. 4 is a conceptual diagram that illustrates a relation between transform coefficients in a video block and a significance map associated with the video block. As illustrated in FIG. 4, the significance map includes a "1" to indicate each instance of a significant coefficient value, i.e., a value greater than zero, in the video block. The significance map may be signaled in a bitstream that is decodable by a video decoder, such as video decoder 30, to determine the location of the significant, i.e., greater than zero, coefficients in the video block to be decoded. More specifically, a position of a last non-zero coefficient within the video block may be signaled in the bitstream. The positional of the last non-zero coefficient in the video block depends on the scanning order used for the video block. Additional syntax elements may be signaled to indicate the other significant coefficients relative to the last non-zero coefficient according to a known or knowable scanning order.

FIGS. 5A-5D are conceptual diagrams that illustrate examples of blocks of video data scanned using a zig-zag scanning order, a horizontal scanning order, a vertical scanning order, and a diagonal scanning order. As shown in FIGS. 5A-5D, an 8×8 block of video data, e.g., a TU of a CU, may include sixty-four transform coefficients in corresponding block positions, denoted with circles. In this example, blocks 100, 102, 104 and 106 each have a size of 8×8 and, therefore, include sixty-four transform coefficients generated using prediction techniques previously described.

According to the techniques described in this disclosure, the sixty-four transform coefficients in each of blocks 100, 102, 104 and 106 may have been transformed, or may be inverse transformed, using one of a 2-D transform, a horizontal 1-D transform, and a vertical 1-D transform, or the transform coefficients may not be transformed at all. Whether transformed or not, the coefficients in each of video blocks 100, 102, 104 and 106 are scanned in preparation for entropy coding using one of the zig-zag scanning order, the horizontal scanning order, the vertical scanning order, and the diagonal scanning order.

Figure 5A:
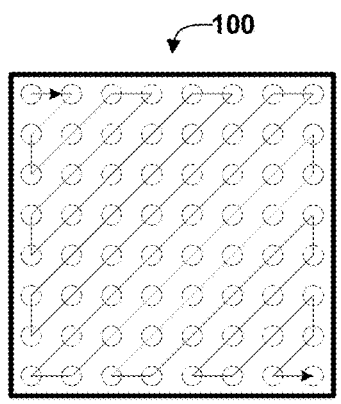
FIGS. 5A-5D are conceptual diagrams that illustrate examples of blocks of video data scanned using a zig-zag scanning order, a horizontal scanning order, a vertical scanning order, and a diagonal scanning order.
Figure 5B:
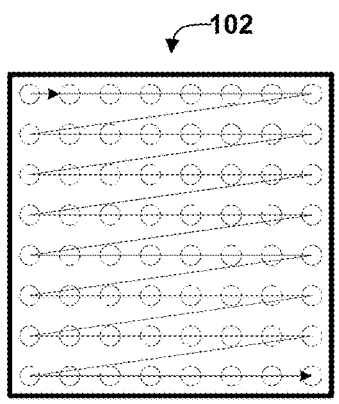
Figure 5C:
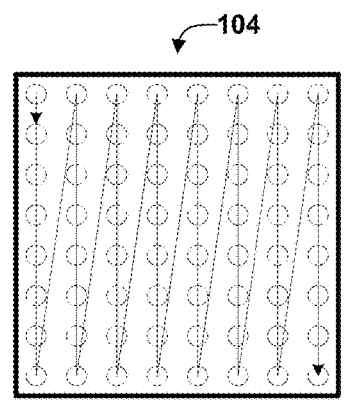
Figure 5D:
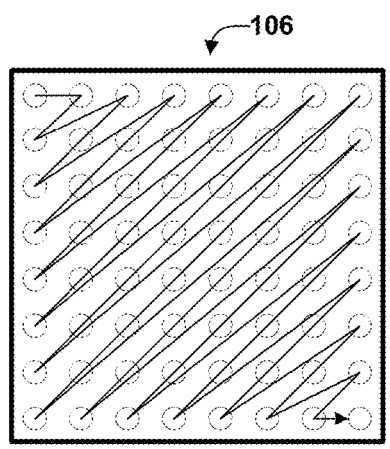

As shown in FIG. 5A, the scanning order associated with block 100 is the zig-zag scanning order. The zig-zag scanning order causes a video coder, such as video encoder 20 or video decoder 30, to scan the quantized transform coefficients of block 100 in a diagonal manner as indicated by the arrows in FIG. 5A. Similarly in FIG. 5D, the diagonal scanning order causes a video coder to scan the quantized transform coefficients of block 106 in a diagonal manner as indicated by the arrows in FIG. 5D. As shown in FIGS. 5B and 5C, the scanning orders associated with blocks 102 and 104 are the horizontal scanning order and the vertical scanning order, respectively. The horizontal scanning order causes a video coder to scan quantized transform coefficients of block 102 in a horizontal line-by-line, or "raster" manner, while the vertical scanning order causes a video coder to scan the quantized transform coefficients of block 104 in a vertical line-by-line, or "rotated raster" manner, also as indicated by the arrows in FIGS. 5B and 5C.

In other examples, as described above, a block may have a size that is smaller or larger than the size of blocks 100, 102, 104 and 106, and may include more or fewer quantized transform coefficients and corresponding block positions. In these examples, a scanning order associated with a particular block may causes a video coder to scan the quantized transform coefficients of the block in a substantially similar manner as shown in the examples of 8×8 blocks of FIGS. 5A-5D, e.g., a 4×4 block or a 16×16 block, may be scanned following any of the scanning orders previously described.

Although the direction of scans in FIGS. 5A-5D generally is shown as proceeding from low-frequency coefficients to high-frequency coefficients, in other examples, video encoder 20 and video decoder 30 may be configured to perform an inverse scan order, in which the scan may proceed from the high-frequency coefficients to the low-frequency coefficients. That is, video encoder 20 and video decoder 30 may scan the coefficients in the reverse order of that shown in FIGS. 5A-5D.

Figure 6:
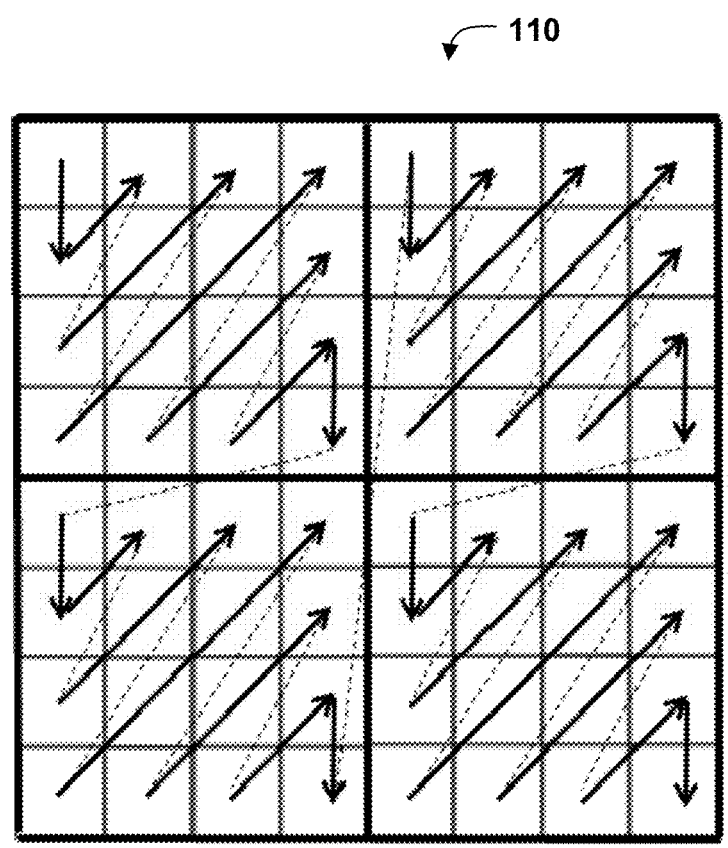
FIG. 6 is a conceptual diagram that illustrates an example video block divided into sub-blocks for transform coefficient coding.

FIG. 6 is a conceptual diagram that illustrates an example video block 110 divided into sub-blocks for transform coefficient coding. In the current HM, a sub-block concept is used for transform coefficient coding. A video coder may sub-divide any transform unit (TU) that is larger than a determined sub-block size into sub-blocks. For example, video block 110 is divided into four 4×4 sub-blocks.

In the illustrated example of FIG. 6, the video coder divides video block 110 into 4×4 sub-blocks. In other examples, the video coder may divide video blocks into sub-blocks of other sizes, e.g., 8×8, 16×16, and the like. If the video coder uses the same sub-block size for all TUs of a frame or slice, gains may be achieved in a hardware implementation due to the uniformity achieved with the sub-block sizes. For example, all processing may be split in such sub-blocks, regardless of the TU size. A uniform sub-block size is not necessary, however, to carry out the techniques of this disclosure.

For coefficient coding, a video coder may scan each 4×4 sub-block of video block 110 using a diagonal scanning order, as shown on FIG. 6. In some examples, the video coder may use a unified scan for scanning transform coefficients of each sub-block. In this case, the same scan order is used for significance information, i.e., a significance map, coefficient levels, sign, and the like. In a first example, as shown in FIG. 6, the video coder may scan the transform coefficients using a diagonal scan. In another example, the video coder may scan the transform coefficients in an order that is opposite of that shown in FIG. 6, e.g., a reverse diagonal scan that begins in the lower right corner and proceeds to the upper left corner. In other examples, the video coder may scan the transform coefficients using a zig-zag, horizontal, or vertical scan. Other scanning directions/orientations are also possible.

For ease of explanation, this disclosure describes sub-blocks of a video block as being 4×4 sub-blocks. The techniques of this disclosure, however, may also be applied with respect to sub-blocks of different sizes, e.g., 8×8, 16×16, and the like. For every 4×4 block a significant_coeffgroup_flag is coded, and if there is at least one nonzero coefficient in the sub-block this flag is set to one, otherwise it is equal to zero. If significant_coeffgroup_flag is nonzero for a given sub-block, the 4×4 sub-block is scanned in the backward diagonal order and significant_coeff_flag is coded for every coefficient of the sub-block to indicate the significance of the coefficient. The group of these flags may be referred to as a significance map for the video block. In some example, instead of explicitly signaling the significance map, the significant_coeffgroup_flag may be implicitly derived using neighboring 4×4 sub-block flags, or when the 4×4 sub-block contains the last coefficient or a DC coefficient. Absolute values of the coefficients are also coded, i.e., coefficient levels.

Although the direction of the scan in FIG. 6 is generally shown as proceeding from low-frequency coefficients to high-frequency coefficients, in other examples, video encoder 20 and video decoder 30 may be configured to perform an inverse scan order, in which the scan may proceed from the high-frequency coefficients to the low-frequency coefficients. That is, video encoder 20 and video decoder 30 may scan the coefficients in the reverse order of that shown in FIG. 6.

FIG. 7 is a conceptual diagram that illustrates an example five-point support neighborhood used to define a context model for selection of contexts for a significance map of coefficients in a video block 112 scanned using a reverse diagonal scanning order. As noted above, for context-adaptive coding, transform coefficients may be coded based on a context model that describes probabilities of the transform coefficient having a value of 0 or a value of 1. With respect to significance map coding, the context model describes the probabilities of whether a particular transform coefficient is significant, i.e., non-zero.

For the significance map coding, a five-point support S may be used to define a context model to code the significance map of the transform coefficients of video block 112. The five-point support may be referred to as a "context support neighborhood," or simply a "support neighborhood." That is, a video coder may look to the support to determine the probability of the significance of a current position being one or zero. The context support neighborhood defines the neighboring coefficients (e.g., which may include significance information) that may be used as contexts for coding a current coefficient. According to some examples of this disclosure, the context support neighborhood may be different for different coefficient positions within a block or sub-block.

In the example shown in FIG. 7, the five-point support S is represented by a dot surrounded by a square, relative to a current or "target" position represented by a dot surrounded by a circle. Context model Ctx (equation (1) below) may be defined as a sum of the significant flags in every point of the support, where a significance flag may be set to "1" if the corresponding transform coefficient is nonzero, and set to "0" otherwise.

$$Ctx = \sum_{p \in S} (coef_p != 0) \quad (1)$$

Accordingly, the significance flag count can be less or equal to the support cardinality. The value of ctx is not necessarily the raw context value, but may be applied to a base context value, in the form of an offset, to derive the context to be used to code data for a particular coefficient.

However, the support S shown in FIG. 7 may not be suitable when calculating context for more than one transform coefficient (e.g., significance information associated with the transform coefficient) in parallel (referred to as "parallel significance context calculation" or simply "parallel context calculation"). For example, using the support S shown in FIG. 7 may impede the ability of the video coder to calculate contexts for significance information in parallel, because all data in the support S must be available (e.g., already coded) for enabling parallel calculation of contexts. In some instances, as described below with respect to FIG. 8A, a coder may be forced to wait for a support element in support S to finish coding before determining the context for another support element in support S. This delay reduces the ability of the video coder to efficiently process significance information.

FIGS. 8A and 8B are conceptual diagrams that illustrate context dependency within the five-point support. For example, to calculate a significance context for the circled position, it may be necessary to parse the significance flag of the position within the support S depicted by a diamond (shown in FIG. 8A). Such parsing may introduce a delay if there is a requirement to calculate significance contexts of two coefficients in parallel, because the diamond is positioned immediately before the circled element in scanning order. That is, the context of the circled position cannot be calculated at the same time as the position marked by a diamond, because the circled position depends on the position marked by the diamond, and therefore, the position marked by a diamond must be coded prior to determining the context for the circled position.

To resolve this dependency, certain elements may be removed from support S, making the support with a so called "hole" (non-filled dot surrounded by a triangle, shown in FIG. 8B). For example, the significance flag in the hole is skipped and not taken into account for the context calculation (i.e., assumed to be zero). Accordingly, there is no need to parse the significance flag in the hole position. The 5-point support shape depends on the position to allow for better parallel processing.

FIGS. 9A and 9B are conceptual diagrams that illustrate example divisions of a video block into two or more regions. In the current HM, neighborhood context modeling is used for TU sizes greater than 8×8 (that is, 16×16, 32×32 and the non-square transform sizes 16×4, 4×16, 32×8 and 8×32) with the 5-point support. However, context modeling with the 5-point support may increase the complexity of the context calculations in the larger block sizes. Region R1 of FIG. 9A represents an example of a region including one or more upper-left 4×4 sub-blocks of transform coefficients of a video block, while region R2 of FIG. 9A represents an example of a region including transform coefficients of the video block outside region R1. FIG. 9A also represents an example in which a plurality of regions comprise respective sets of one or more sub-blocks.

In accordance with the techniques described in this disclosure, a video coder, such as video encoder 20 or video decoder 30, may divide a video block into regions R (e.g., as shown in FIGS. 9A and 9B) and use different context assignment procedures for each of the different regions. For example, some regions may use fixed or position-based context and some regions may use neighborhood-based context. As illustrated in FIG. 9A, the regions may be based on 4×4 sub-blocks such that entire sub-blocks are included in one region or another. Also, the division into the regions may be flexible in some examples. As illustrated in FIG. 9B, the video block may be divided into regions in the diagonal direction such that portions of sub-blocks may be included in two different regions. In other examples, the division might be dependent on the coefficient positions or the position of the 4×4 sub-block containing this coefficient.

In some examples, context may be defined according to the coefficient position in the video block, or according to the position of the 4×4 sub-block that contains this coefficient. Alternatively, the context model might be defined according to the neighbor 4×4 sub-blocks. For example, every coefficient within same 4×4 sub-block can use one or several contexts, coefficients of the next 4×4 sub-block can use also one or several contexts. However, contexts of one 4×4 sub-block might be different from previous 4×4 sub-block based contexts. Alternatively, contexts might be calculated as Ctx=Right4×4SubBlockFlag+Bottom4×4Sub-BlockFlag, or similar formulas depending on the neighborhood. Again, the Right4×4SubBlockFlag may represent a coded sub-block flag for a right-neighboring sub-block (e.g., indicating whether the right-neighboring, 4×4 sub-block includes at least one non-zero coefficient), and the Bottom4×4SubBlockFlag may represent a coded sub-block flag for a right-neighboring sub-block (e.g., indicating whether the bottom-neighboring, 4×4 sub-block includes at least one non-zero coefficient).

FIG. 10 is a conceptual diagram that illustrates example assignment of neighborhood- or position-based contexts for each region of a video block. As illustrated in FIG. 10, hybrid type of contexts might be used as well, for example, for some regions contexts could be neighborhood based and for some regions of the same video block it can be fixed or position based. A potential advantage of the position-based approach is that it is not necessary to calculate context in a coefficient-wise manner. Instead, a video coder may calculate context once for all coefficients in a region, such that all coefficients in the region have the same context. FIG. 10 represents an example in which a plurality of regions comprises a respective set of one or more sub-blocks.

For a coefficient with coordinates (x, y), regions can be defined according to the coefficient position. For example, if the condition (x+y>=threshold) is true, then the video coder may determine that the corresponding coefficient occurs within region R2; otherwise, if the condition is not true, the video coder determines that the corresponding coefficient occurs within region R1. Similarly, coordinates can be assigned to regions based on 4×4 sub-blocks. For the sub-block with (X, Y) coordinates, regions can be defined according to the 4×4 sub-block position. For example, if the condition (X+Y>=Threshold) is true, than the video coder may determine that the corresponding coefficient occurs within region R2; otherwise, the video coder may determine that the corresponding coefficient occurs within region R1. The threshold may be fixed to some predefined value, such as an integer number equal to 4, 5, 6, 7 or 8, or may dependent on the video block, e.g., TU, size.

In this manner, FIG. 10 represents an example in which a video coder may be configured to determine context for coding a transform coefficient, based on a region in which the transform coefficient occurs, using one of position-based context information and neighborhood-based context information based on the region. In particular, if a transform coefficient is in a first region, the video coder may use a first context determination approach to determine the context for coding the transform coefficient. If a transform coefficient is in a second region, the video coder may use a second context determination approach to determine the context for coding the transform coefficient, where the second context determination approach is different from the first context determination approach and the first region is different from the second region. In an example, the first and second regions do not overlap. Again, examples of the first and second context determination approaches include the use of position-based context information and neighborhood-based context information.

FIG. 11 is a conceptual diagram that illustrates example assignment of context offsets for each region of a video block. The context model may be separate for the different regions, but still use the same method for context calculation. In other words, a video coder may be configured with one method for calculating context for coding a transform coefficient, but may include different context models, determined based on a region in which the transform coefficient occurs.

For example, the context may be calculated based on neighborhood, but for different regions it uses an offset. The offset for each region may be fixed or dependent on one or more of the video block size, the coefficient position in the video block or sub-block, and the sub-block position in the video block. Region R1 of FIG. 11 represents another example of a region including one or more upper-left 4×4 sub-blocks of transform coefficients of a video block, while region R2 of FIG. 11 represents another example of a region including transform coefficients of the video block outside region R1. FIG. 11 also an example in which a plurality of regions comprise respective sets of one or more sub-blocks.

With offset, the context may be calculated according to equation (2).

$$Ctx = \text{offset}(\text{region}) + \sum_{p \in S} (coef_p \mathrel{!}= 0) \qquad (2)$$

Alternatively, the video coder may calculate the context according to a function using Ctx as an input, for example, Ctx=(Ctx+1)>>1.

One example of the region-based offsets is shown on FIG. 11, where regions R1 and R2 are defined based on 4×4 sub-blocks and offsets are different for regions R1 and R2. Offset values offset1 and offset2 could be any integer numbers, for example, offset1=0, offset2=3. In other example, other divisions into regions are also possible, and divisions into more than two regions are also possible.

FIG. 12 is a conceptual diagram that illustrates an example embedded division of a video block into two or more regions based on TU sizes that correlate to existing context models. Since there are several sizes of TU in current HM (4×4, 8×8, 16×16 and 32×32), division of the larger blocks can be done along smaller TU sizes using an embedded style of division, as illustrated in FIG. 12. For the embedded division, the method of context calculation may be shared and the context model itself may be shared.

For example, for a TU size 32×32, in region R1, representing a 4×4 TU, the context calculation may use the same method for context calculation as for an actual TU of size 4×4. In addition, a context model may be shared between the TU of size 4×4 and R1 of the TU of size 32×32, or an offset may be applied to the context model for the TU of size 4×4. As for R2, the context calculation method may be shared between a TU of size 8×8 and R2 of the TU of size 32×32. R3 represents a 16×16 TU region, while R4 represents a 32×32 TU region. A potential advantage of this method is that the same units may be used for the context calculations, and additional correlation between embedded regions and TUs can be taken into account.

Alternatively, using embedded style division, some significance map context models may be shared for dedicated positions among all TUs or some group of TUs. For example, a context model, corresponding to DC coefficients, may be shared among all TUs with sizes from 4×4 to 32×32. As another example, a context model, related to high frequency coefficients, may be shared between all TUs. In these cases, region R1, representing a 4×4 TU, in the TU of size 32×32 may use the same context model for DC coefficients and/or high frequency coefficients as TUs having any of sizes 4×4, 8×8, 16×16, 32×32, and the like.

As a further example, instead of sharing among all TUs, a context model of the coefficients described above (e.g., DC and/or high frequency coefficients) may be shared among only a subset or group of all the TUs. For example, the context model of the coefficient may be shared among only two sizes of TUs, such as 4×4 and 8×8 TUs. In this case, region R1, representing a 4×4 TU, in the TU of size 32×32 may use the same context model for DC coefficients and/or high frequency coefficients as TUs having size 4×4 and 8×8.

In this manner, the example of FIG. 12 represents an example in which a video coder, such as video encoder 20 or video decoder 30, may be configured to determine a region in which a transform coefficient occurs from a plurality of regions of a video block, wherein each of the regions corresponds to a respective one of a plurality of transform unit (TU) sizes, and wherein the video coder determines the context by selecting a context that is shared between the region and a TU having the same size as the region.

FIG. 12 also represents an example in which a video coder, such as video encoder 20 or video decoder 30, may be configured to determining a region in which a transform coefficient occurs from a plurality of regions of a video block, wherein each of the regions corresponds to a respective one of a plurality of transform unit (TU) sizes, and wherein to determine the context, the video coder selects a shared context for dedicated positions of transform coefficients between two or more TUs of different sizes, wherein the region has the same size as one of the two or more TUs of different sizes. The shared context for the dedicated positions of transform coefficients may comprise a context for one of DC coefficients and high frequency coefficients shared between the two or more TUs of different sizes. Additionally or alternatively, the shared context for the dedicated positions of transform coefficients may comprise a shared context between a first TU having a size of 4×4 transform coefficients and a second TU having a size of 8×8 transform coefficients.

FIGS. 13A and 13B are conceptual diagrams that illustrate example divisions of a video block into two or more regions. In a similar manner as described above with respect to examples where regions are based on square, e.g., 4×4, sub-blocks, the techniques of this disclosure also describe a classification method to divide a video block, e.g., a TU, into two or more regions based on rectangular shaped sub-blocks. For example, 2×8 and 8×2 sub-blocks can be used for an 8×8 video block depending on the coefficients scan as shown on FIGS. 13A and 13B. In this example, a video coder applies a horizontal scan for the coefficients in the block shown in FIG. 13A and a vertical scan to the block shown in FIG. 13B. In the examples illustrated in FIGS. 13A and 13B, one square block represents one single coefficient, and the size of the entire video block is 8×8.

According to the techniques of this disclosure, the video block may be divided into different rectangular regions, e.g., R1, R2, R3, and R4. Each of the different rectangular regions may have a different context assignment. For example, for some regions, a fixed context may be used. These regions may be formed based on rectangular (for example 2×8 or 8×2) sub-blocks, described above and shown in FIGS. 13A and 13B. For example, context could be defined according to the coefficient position in the video block, or according to the position of the rectangular sub-block that contains this coefficient.

Alternatively, the context model might be defined according to the neighbor rectangular shaped sub-blocks. For example, every coefficient within the same rectangular sub-block can use one or several contexts. In addition, coefficients of the neighboring rectangular sub-block can also use one or several contexts. However, contexts of one rectangular sub-block may be different from previous rectangular sub-block based contexts. A hybrid type of contexts might be used as well, for example, for some regions contexts may be neighborhood based and for some regions of the same video block it can be fixed or position based. An advantage of the position based approach is that it is not necessary to calculate context coefficient-wise, it can be done once for a region. Also, the division might be dependent on the coefficient positions or the position of the rectangular sub-block containing this coefficient.

For a coefficient with (x, y) coordinates, regions can be defined according to the coefficient position. For example, if the condition (x+y>=threshold) is true, then this coefficient may be assigned to region R2; otherwise, it may be assigned to region R1. In a similar manner this can be done based on a rectangular shaped sub-block, for the sub-block with (X, Y) coordinates, regions can be defined according to the rectangular sub-block position. For example, if the condition (X+Y>=Threshold) is true than this coefficient may be assigned to region R2, otherwise it may be assigned to R1. The threshold may be fixed to some predefined value, like integer number (e.g., equal to 0 or 1) or might be dependent on TU size.

Alternatively, a context model may be different for the different regions, but still use the same method for context calculation. For example, context may be calculated based on neighborhood, but for different regions it uses an offset. An offset can be fixed, video block size dependent, or be dependent on one or more of: coefficient position in the video block and/or rectangular sub-block, position of the rectangular sub-block containing the current coefficient in the video block, or any combination of these conditions.

With an offset, the context may be calculated according to equation (3).

$$Ctx = \text{offset}(\text{region}) + \sum_{p \in S} (coef_p \mathrel{!}= 0) \quad (3)$$

Alternatively, the context may be calculated according to a function using Ctx as an input, for instance, Ctx=(Ctx+1)>>1.

Figure 14A:
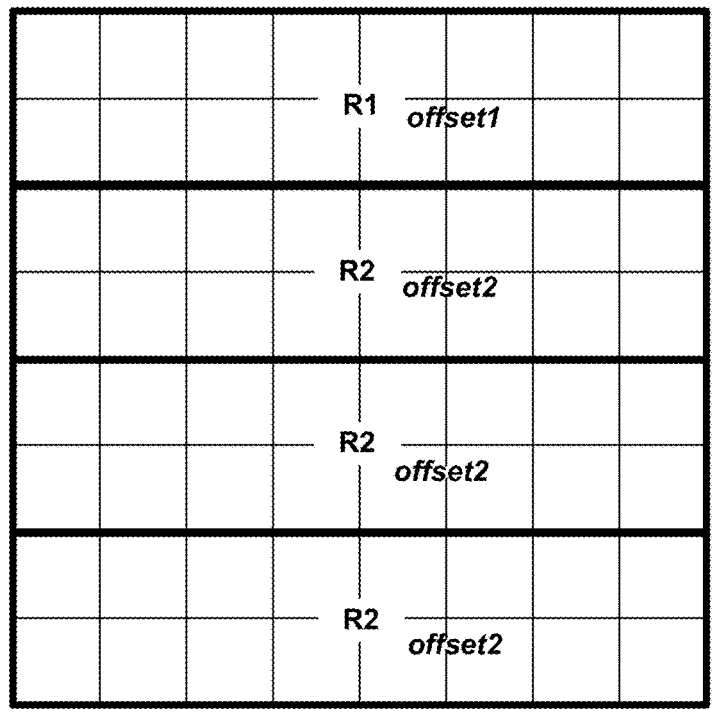
FIGS. 14A and 14B are conceptual diagrams that illustrate example assignment of context offsets for each region of a video block.
Figure 14B:
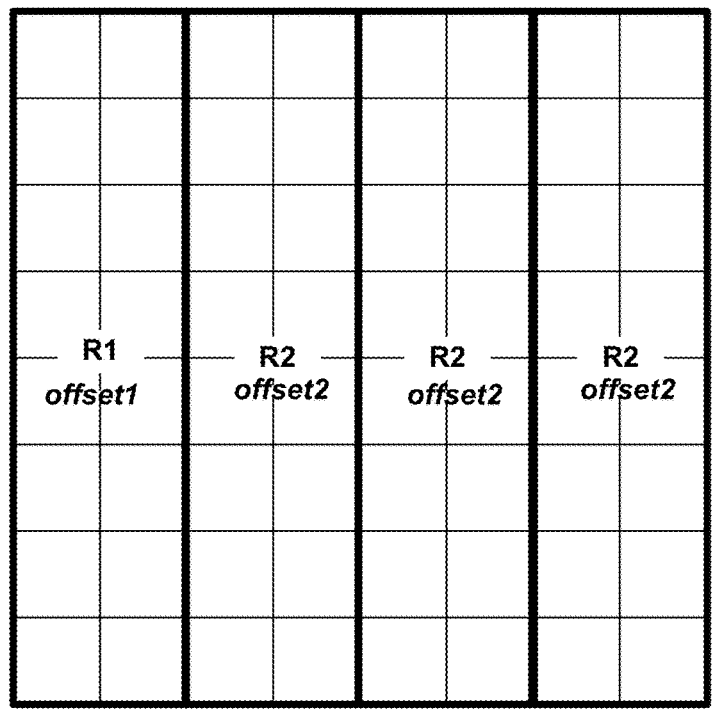

FIGS. 14A and 14B are conceptual diagrams that illustrate example assignment of context offsets for each region of a video block. In these examples, regions R1 and R2 are defined based on rectangular sub-blocks and scan direction, and offsets are different for regions R1 and R2. Offset values offset1 and offset2 could be any integer numbers, for example offset1=0, offset2=3. Other divisions into regions are also possible. For example, a number of regions can be more than two. It should be noted that, 2×8 and 8×2 rectangular sub-blocks, depending on coefficient scanning directions, were used in this disclosure as an example. Similar methods can be used for other rectangular-shaped sub-blocks with size M×N without restriction.

In general, this disclosure describes diagonal based, square, e.g., 4×4, sub-block based, and rectangular, e.g., 2×8 and 8×2, sub-block based division of video blocks. In other examples, other types of division are possible, and division can be flexible based on various shapes, e.g., rectangular, square, triangular and the like, with different sizes. This disclosure also describes dividing video blocks into any number of regions. This disclosure further describes grouping coefficients into regions based on square sub-block, rectangular sub-blocks, or based on other groupings such as diagonal divisions of a video block. Thresholds and offsets described above are also provided as an example, other values or neighbor dependencies could be exploited.

Similar techniques as described in this disclosure can be used for non-square transform units or other shapes of units. The described techniques may be applied to significance map coding, and to other syntax and bin coding of transform coefficients without limitation. In addition, this disclosure typically refers to the video blocks as TU blocks, but the techniques may be applied to any of TUs, PUs, CUs, LCUs or other groups of blocks.

Figure 15:
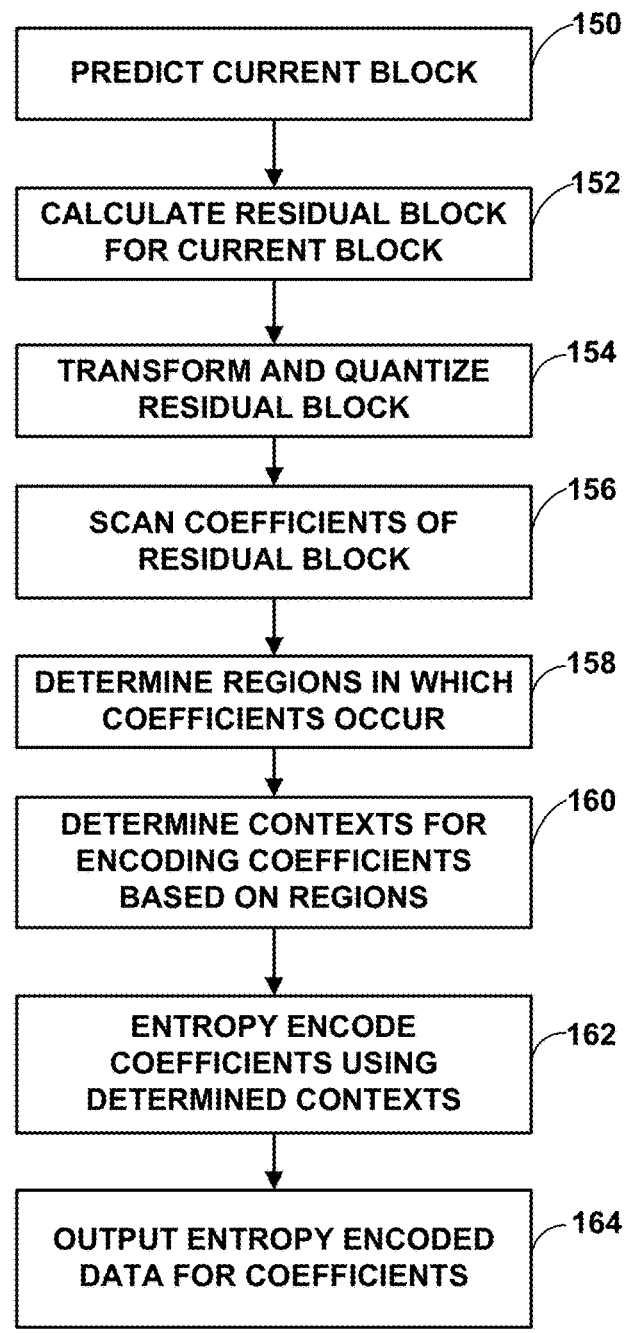
FIG. 15 is a flowchart illustrating an example method for encoding a current block.

FIG. 15 is a flowchart illustrating an example method for encoding a current block. The current block may comprise a current CU or a portion of the current CU. Although described with respect to video encoder 20 (FIGS. 1 and 2), it should be understood that other devices may be configured to perform a method similar to that of FIG. 15.

In this example, video encoder 20 initially predicts the current block (150). For example, video encoder 20 may calculate one or more prediction units (PUs) for the current block. Video encoder 20 may then calculate a residual block for the current block, e.g., to produce a transform unit (TU) (152). To calculate the residual block, video encoder 20 may calculate a difference (that is, pixel-by-pixel differences) between the original, uncoded block and the predicted block for the current block. Video encoder 20 may then transform and quantize coefficients of the residual block (154). Next, video encoder 20 may scan the quantized transform coefficients of the residual block (156).

During the scan, video encoder 20 may determine a region in which a current coefficient occurs, and in this manner, video encoder 20 may determine regions in which the various coefficients occur (158). In accordance with the techniques of this disclosure, video encoder 20 may determine regions in which coefficients occur based on, for example, positions of the coefficients or positions of sub-blocks in which the coefficients occur. Video encoder 20 may determine regions using any of the techniques described with respect to FIGS. 9-14, or other similar techniques. For example, as shown in FIG. 9A, video encoder 20 may be configured to determine whether a coefficient occurs in a first region including one or more sub-blocks, or a second region including sub-blocks outside the first region.

Video encoder 20 may further determine contexts for entropy encoding coefficients based on the regions (160). That is, video encoder 20 may determine, for each coefficient, a context for encoding the coefficient based on the region in which the coefficient occurs. For example, as discussed above, video encoder 20 may determine the context based on a position of the coefficient in the block, a position of a sub-block including the coefficient in the block, an offset to be applied to a calculated context, or the like based on the region in which the coefficient occurs.

Likewise, video encoder 20 may entropy encode the coefficients using the determined contexts (162). In particular, video encoder 20 may entropy encode one or more syntax elements representative of the coefficients using the context. For example, video encoder 20 may entropy encode one or more of significance information for the coefficients, level information for the significant coefficients, and/or sign information for the significant coefficients. Significance information may comprise significant_coeff_flag data. Level information may comprise coeff_abs_level_greater1_flag, coeff_abs_level_greater2_flag, and coeff_abs_level_remaining. Sign information may comprise coeff_sign_flag. Video encoder 20 may then output the entropy encoded data for the coefficients (164).

In this manner, the method of FIG. 15 represents an example of a method including determining a context for coding a transform coefficient of a video block based on a region of the video block in which the transform coefficient occurs, and entropy coding the transform coefficient using the determined context. Moreover, the region may comprise one of a first region comprising one or more upper-left 4×4 sub-blocks of transform coefficients of the video block and a second region comprising transform coefficients of the video block outside the first region.

Figure 16:
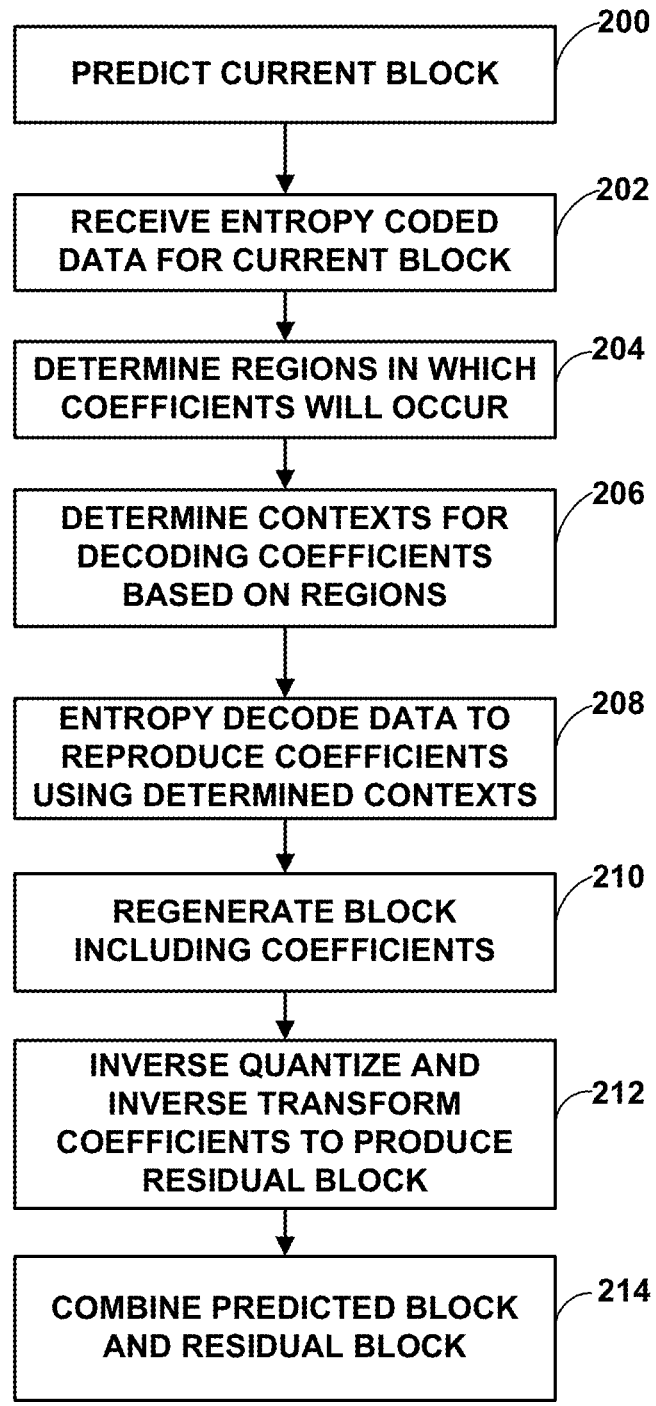
FIG. 16 is a flowchart illustrating an example method for decoding a current block of video data.

FIG. 16 is a flowchart illustrating an example method for decoding a current block of video data. The current block may comprise a current CU or a portion of the current CU. Although described with respect to video decoder 30 (FIGS. 1 and 3), it should be understood that other devices may be configured to perform a method similar to that of FIG. 16.

Video decoder 30 may predict the current block (200), e.g., using an intra- or inter-prediction mode to calculate a predicted block for the current block. Video decoder 30 may also receive entropy encoded data for the current block, such as entropy encoded data for coefficients of a residual block corresponding to the current block (202).

In accordance with the techniques of this disclosure, video decoder 30 may determine regions in which the coefficients will occur (204), e.g., during an inverse scan and entropy decoding process. That is, video decoder 30 may determine the position of the next transform coefficient based on the position of a previously decoded transform coefficient and a next significant transform coefficient in scan order. Video decoder 30 may further determine a region of the block in which this position occurs. Video decoder 30 may similarly determine regions for each of the coefficients in a similar manner.

Moreover, video decoder 30 may determine regions in which coefficients will occur based on, for example, positions of the coefficients or positions of sub-blocks in which the coefficients will occur. Video decoder 30 may determine regions using any of the techniques described with respect to FIGS. 9-14, or other similar techniques. For example, as shown in FIG. 9A, video decoder 30 may be configured to determine whether a coefficient occurs in a first region including one or more sub-blocks, or a second region including sub-blocks outside the first region.

Furthermore, video decoder 30 may determine contexts for decoding the coefficients based on the determined regions (206). That is, video decoder 30 may determine, for each coefficient, a context for decoding the coefficient based on the region in which the coefficient occurs. For example, as discussed above, video decoder 30 may determine the context based on a position of the coefficient in the block, a position of a sub-block including the coefficient in the block, an offset to be applied to a calculated context, or the like, based on the region in which the coefficient will occur.

Video decoder 30 may entropy decode the entropy coded data to reproduce coefficients of the block using the determined contexts (208). In particular, video decoder 30 may entropy decode one or more syntax elements representative of the coefficients using the context. For example, video decoder 30 may entropy decode one or more of significance information for the coefficients, level information for the significant coefficients, and/or sign information for the significant coefficients. Significance information may comprise significant_coeff_flag data. Level information may comprise coeff_abs_level_greater1_flag, coeff_abs_level_greater2_flag, and coeff_abs_level_remaining. Sign information may comprise coeff_sign_flag. Video decoder 30 may then regenerate the block (e.g., the TU) to include the decoded transform coefficients in their respective positions (210). That is, as discussed above, video decoder 30 may inverse scan the reproduced coefficients to create a block of quantized transform coefficients.

Video decoder 30 may then inverse quantize and inverse transform the coefficients to produce a residual block (212). Video decoder 30 may ultimately decode the current block by combining the predicted block and the residual block (214). That is, video decoder 30 may mathematically combine the pixel values of the predicted block with co-located pixel values of the residual block to decode and reproduce the original block.

In this manner, the method of FIG. 16 represents an example of a method including determining a context for coding a transform coefficient of a video block based on a region of the video block in which the transform coefficient occurs, and entropy coding the transform coefficient using the determined context. Moreover, the region may comprise one of a first region comprising one or more upper-left 4×4 sub-blocks of transform coefficients of the video block and a second region comprising transform coefficients of the video block outside the first region.

In one or more examples, the functions described may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of decoding video data, the method comprising:
  determining values for coded sub-block flags of one or more neighboring sub-blocks to a current sub-block;
  determining that a coded sub-block flag of the current sub-block indicates that the current sub-block includes at least one non-zero transform coefficient;
  in response to the determination that the coded sub-block flag of the current sub block indicates that the current sub-block includes the at least one non-zero transform coefficient, using the values for the coded sub-block flags of the neighboring sub-blocks to determine a context for entropy decoding one or more syntax elements of the at least one non-zero transform coefficient of the current sub-block, wherein using the values comprises:
    determining a first context for entropy decoding the one or more syntax elements of the at least one non-zero transform coefficient when the values for the coded sub-block flags of the neighboring sub-blocks have a first set of values; and
    determining a second context for entropy decoding the one or more syntax elements of the at least one non-zero transform coefficient when the values for the coded sub-block flags of the neighboring sub-blocks have a second set of values, the first context being different than the second context and the first set of values being different than the second set of values; and entropy decoding the one or more syntax elements of the individual transform coefficient using the determined context.

2. The method of claim 1, wherein the one or more neighboring sub-blocks comprise a right-neighboring sub-block and a bottom-neighboring sub-block.

3. The method of claim 2, wherein determining the context comprises calculating the sum of a value for a coded sub-block flag of the right-neighboring sub-block and a value for a coded sub-block flag of the bottom-neighboring sub-block and using the calculated sum to determine the context.

4. The method of claim 1, wherein the coded sub-block flags represent whether respective ones of the neighboring sub-blocks include at least one non-zero transform coefficient.

5. The method of claim 1, wherein each of the sub-blocks corresponds to a respective 4×4 block of transform coefficients, and wherein the coded sub-block flags indicate whether at least one of the transform coefficients in the respective 4×4 block has a non-zero value.

6. The method of claim 1, wherein the current sub-block has a size of 4×4 pixels, and wherein the current sub-block is within a current transform unit having a size greater than 4×4 pixels.

7. The method of claim 1, wherein determining the context further comprises determining the context for decoding the transform coefficient based on a position of the transform coefficient in the current sub-block.

8. The method of claim 1, wherein entropy decoding the transform coefficient comprises entropy decoding the transform coefficient according to context adaptive binary arithmetic coding (CABAC).

9. The method of claim 1, wherein the one or more syntax elements comprise a significant coefficient flag of the individual transform coefficient representative of whether the individual transform coefficient has a non-zero value.

10. The method of claim 1, the method being executable on a wireless communication device, wherein the device comprises:
a memory configured to store video data including the coded sub-block flags, the neighboring sub-blocks, and the current block;
a processor configured to execute instructions to process the video data stored in said memory; and
a receiver configured to receive the video data.

11. The method of claim 10, wherein the wireless communication device is a cellular telephone and the video data is received by the transmitter and modulated according to a cellular communication standard.

12. A device for decoding video data, the device comprising:
a memory configured to store video data; and
a video decoder configured to:
determine values for coded sub-block flags of one or more neighboring sub-blocks to a current sub-block of the video data,
determine that a coded sub-block flag of the current sub-block indicates that the current sub-block includes at least one non-zero transform coefficient;
in response to the determination that the coded sub-block flag of the current sub block indicates that the current sub-block includes the at least one non-zero transform coefficient, use the values for the coded sub-block flags of the neighboring sub-blocks to determine a context for entropy decoding one or more syntax elements of the at least one non-zero transform coefficient of the current sub-block, wherein the video decoder is configured to:
determine a first context for entropy decoding the one or more syntax elements of the at least one non-zero transform coefficient when the values for the coded sub-block flags of the neighboring sub-blocks have a first set of values; and
determine a second context for entropy decoding the one or more syntax elements of the at least one non-zero transform coefficient when the values for the coded sub-block flags of the neighboring sub-blocks have a second set of values, the first context being different than the second context and the first set of values being different than the second set of values, and
entropy decode the one or more syntax elements of the individual transform coefficient using the determined context.

13. The device of claim 12, wherein the one or more neighboring sub-blocks comprise a right-neighboring sub-block and a bottom-neighboring sub-block.

14. The device of claim 13, wherein to determine the context, the video decoder is configured to calculate the sum of a value for a coded sub-block flag of the right-neighboring sub-block and a value for a coded sub-block flag of the bottom-neighboring sub-block and use the calculated sum to determine the context.

15. The device of claim 12, wherein the coded sub-block flags represent whether respective ones of the neighboring sub-blocks include at least one non-zero transform coefficient.

16. The device of claim 12, wherein the video decoder is further configured to determine the context for decoding the transform coefficient based on a position of the transform coefficient in the current sub-block.

17. The device of claim 12, wherein the video decoder is configured to entropy decode the transform coefficient according to context adaptive binary arithmetic coding (CABAC).

18. The device of claim 12, wherein the one or more syntax elements comprise a significant coefficient flag of the individual transform coefficient representative of whether the individual transform coefficient has a non-zero value.

19. The device of claim 12, wherein the device is a wireless communication device, further comprising a receiver configured to receive the video data.

20. The device of claim 19, wherein the wireless communication device is a cellular telephone and the video data is received by the receiver and modulated according to a cellular communication standard.

21. A device for decoding video data, the device comprising:
means for determining values for coded sub-block flags of one or more neighboring sub-blocks to a current sub-block;
means for determining that a coded sub-block flag of the current sub-block indicates that the current sub-block includes at least one non-zero transform coefficient;
means for using, in response to the determination that the coded sub-block flag of the current sub block indicates that the current sub-block includes the at least one non-zero transform coefficient, the values for the coded sub-block flags of the neighboring sub-blocks to determine a context for entropy decoding one or more syntax elements of the at least one non-zero transform coefficient of the current sub-block, wherein the means for using the values comprise:
means for determining a first context for entropy decoding the one or more syntax elements of the at least one non-zero transform coefficient when the values for the coded sub-block flags of the neighboring sub-blocks have a first set of values; and
means for determining a second context for entropy decoding the one or more syntax elements of the at least one non-zero transform coefficient when the values for the coded sub-block flags of the neighboring sub-blocks have a second set of values, the first context being different than the second context and the first set of values being different than the second set of values; and
means for entropy decoding the one or more syntax elements of the individual transform coefficient using the determined context.

22. The device of claim 21, wherein the one or more neighboring sub-blocks comprise a right-neighboring sub-block and a bottom-neighboring sub-block.

23. The device of claim 22, wherein the means for determining the context comprises means for calculating the sum of a value for a coded sub-block flag of the right-neighboring sub-block and a value for a coded sub-block flag of the bottom-neighboring sub-block and means for using the calculated sum to determine the context.

24. The device of claim 21, wherein the coded sub-block flags represent whether respective ones of the neighboring sub-blocks include at least one non-zero transform coefficient.

25. The device of claim 21, wherein the means for determining the context further comprises means for determining the context for decoding the transform coefficient based on a position of the transform coefficient in the current sub-block.

26. The device of claim 21, wherein the means for entropy decoding the transform coefficient comprises means for entropy decoding the transform coefficient according to context adaptive binary arithmetic coding (CABAC).

27. The device of claim 21, wherein the one or more syntax elements comprise a significant coefficient flag of the individual transform coefficient representative of whether the individual transform coefficient has a non-zero value.

28. A non-transitory computer-readable storage medium having stored thereon instructions that, when executed, cause a processor to:
determine values for coded sub-block flags of one or more neighboring sub-blocks to a current sub-block;
in response to the determination that the coded sub-block flag of the current sub block indicates that the current sub-block includes the at least one non-zero transform coefficient, determine that a coded sub-block flag of the current sub-block indicates that the current sub-block includes at least one non-zero transform coefficient;
use the values for the coded sub-block flags of the neighboring sub-blocks to determine a context for entropy decoding one or more syntax elements of the at least one non-zero transform coefficient of the current sub-block, wherein the instructions that cause the processor to use the values comprise instructions that cause the processor to:
determine a first context for entropy decoding the one or more syntax elements of the at least one non-zero transform coefficient when the values for the coded sub-block flags of the neighboring sub-blocks have a first set of values; and
determine a second context for entropy decoding the one or more syntax elements of the at least one non-zero transform coefficient when the values for the coded sub-block flags of the neighboring sub-blocks have a second set of values, the first context being different than the second context and the first set of values being different than the second set of values; and
entropy decode the one or more syntax elements of the individual transform coefficient using the determined context.

29. A method of encoding video data, the method comprising:
determining values for coded sub-block flags of one or more neighboring sub-blocks to a current sub-block;
encoding a value for a coded sub-block flag of the current sub-block that indicates that the current sub-block includes at least one non-zero transform coefficient;
in response to the current sub block including the at least one non-zero transform coefficient, using the values for the coded sub-block flags of the neighboring sub-blocks to determine a context for entropy encoding one or more syntax elements of the at least one non-zero transform coefficient of the current sub-block, wherein using the values comprises:
determining a first context for entropy decoding the one or more syntax elements of the at least one non-zero transform coefficient when the values for the coded sub-block flags of the neighboring sub-blocks have a first set of values; and
determining a second context for entropy decoding the one or more syntax elements of the at least one non-zero transform coefficient when the values for the coded sub-block flags of the neighboring sub-blocks have a second set of values, the first context being different than the second context and the first set of values being different than the second set of values; and
entropy encoding the one or more syntax elements of the individual transform coefficient using the determined context.

30. The method of claim 29, wherein the one or more neighboring sub-blocks comprise a right-neighboring sub-block and a bottom-neighboring sub-block.

31. The method of claim 30, wherein determining the context comprises calculating the sum of a value for a coded sub-block flag of the right-neighboring sub-block and a value for a coded sub-block flag of the bottom-neighboring sub-block and using the calculated sum to determine the context.

32. The method of claim 29, wherein the coded sub-block flags represent whether respective ones of the neighboring sub-blocks include at least one non-zero transform coefficient.

33. The method of claim 29, wherein each of the sub-blocks corresponds to a respective 4×4 block of transform coefficients, and wherein the coded sub-block flags indicate whether at least one of the transform coefficients in the respective 4×4 block has a non-zero value.

34. The method of claim 29, wherein the current sub-block has a size of 4×4 pixels, and wherein the current sub-block is within a current transform unit having a size greater than 4×4 pixels.

35. The method of claim 29, wherein determining the context further comprises determining the context for encoding the transform coefficient based on a position of the transform coefficient in the current sub-block.

36. The method of claim 29, wherein entropy encoding the transform coefficient comprises entropy encoding the transform coefficient according to context adaptive binary arithmetic coding (CABAC).

37. The method of claim 29, wherein the one or more syntax elements comprise a significant coefficient flag of the individual transform coefficient representative of whether the individual transform coefficient has a non-zero value.

38. A device for encoding video data, the device comprising:
a memory configured to store video data; and
a video encoder configured to:
determine values for coded sub-block flags of one or more neighboring sub-blocks to a current sub-block of the video data,
encode a value for a coded sub-block flag of the current sub-block that indicates that the current sub-block includes at least one non-zero transform coefficient:
in response to the current sub block including the at least one non-zero transform coefficient, use the values for the coded sub-block flags of the neighboring sub-blocks to determine a context for entropy encoding one or more syntax elements of the at least one non-zero transform coefficient of the current sub-block, wherein the video encoder is configured to:
determine a first context for entropy decoding the one or more syntax elements of the at least one non-zero transform coefficient when the values for the coded sub-block flags of the neighboring sub-blocks have a first set of values; and
determine a second context for entropy decoding the one or more syntax elements of the at least one non-zero transform coefficient when the values for the coded sub-block flags of the neighboring sub-blocks have a second set of values, the first context being different than the second context and the first set of values being different than the second set of values, and
entropy encode the one or more syntax elements of the individual transform coefficient using the determined context.

39. The device of claim 38, wherein the one or more neighboring sub-blocks comprise a right-neighboring sub-block and a bottom-neighboring sub-block.

40. The device of claim 39, wherein to determine the context, the video encoder is configured to calculate the sum of a value for a coded sub-block flag of the right-neighboring sub-block and a value for a coded sub-block flag of the bottom-neighboring sub-block and use the calculated sum to determine the context.

41. The device of claim 38, wherein the coded sub-block flags represent whether respective ones of the neighboring sub-blocks include at least one non-zero transform coefficient.

42. The device of claim 38, the video encoder is further configured to determine the context for decoding the transform coefficient based on a position of the transform coefficient in the current sub-block.

43. The device of claim 38, wherein the video encoder is configured to entropy encode the transform coefficient according to context adaptive binary arithmetic coding (CABAC).

44. The device of claim 38, wherein the one or more syntax elements comprise a significant coefficient flag of the individual transform coefficient representative of whether the individual transform coefficient has a non-zero value.

45. A device for encoding video data, the device comprising:
means for determining values for coded sub-block flags of one or more neighboring sub-blocks to a current sub-block;
means for encoding a value for a coded sub-block flag of the current sub-block that indicates that the current sub-block includes at least one non-zero transform coefficient;
means for using, in response to the current sub block including the at least one non-zero transform coefficient, the values for the coded sub-block flags of the neighboring sub-blocks to determine a context for entropy encoding one or more syntax elements of the at least one non-zero transform coefficient of the current sub-block, wherein the means for using comprise:
means for determining a first context for entropy decoding the one or more syntax elements of the at least one non-zero transform coefficient when the values for the coded sub-block flags of the neighboring sub-blocks have a first set of values; and
means for determining a second context for entropy decoding the one or more syntax elements of the at least one non-zero transform coefficient when the values for the coded sub-block flags of the neighboring sub-blocks have a second set of values, the first context being different than the second context and the first set of values being different than the second set of values; and
means for entropy encoding the one or more syntax elements of the individual transform coefficient using the determined context.

46. The device of claim 45, wherein the one or more neighboring sub-blocks comprise a right-neighboring sub-block and a bottom-neighboring sub-block.

47. The device of claim 46, wherein the means for determining the context comprises means for calculating the sum of a value for a coded sub-block flag of the right-neighboring sub-block and a value for a coded sub-block flag of the bottom-neighboring sub-block and means for using the calculated sum to determine the context.

48. The device of claim 45, wherein the coded sub-block flags represent whether respective ones of the neighboring sub-blocks include at least one non-zero transform coefficient.

49. The device of claim 45, wherein the means for determining the context further comprises means for determining the context for encoding the transform coefficient based on a position of the transform coefficient in the current sub-block.

50. The device of claim 45, wherein the means for entropy encoding the transform coefficient comprises means for entropy encoding the transform coefficient according to context adaptive binary arithmetic coding (CABAC).

51. The device of claim 45, wherein the one or more syntax elements comprise a significant coefficient flag of the individual transform coefficient representative of whether the individual transform coefficient has a non-zero value.

52. A non-transitory computer-readable storage medium having stored thereon instructions that, when executed, cause a processor to:
determine values for coded sub-block flags of one or more neighboring sub-blocks to a current sub-block;

encode a coded sub-block flag of the current sub-block that indicates that the current sub-block includes at least one non-zero transform coefficient;

in response to the current sub block including the at least one non-zero transform coefficient, use the values for the coded sub-block flags of the neighboring sub-blocks to determine a context for entropy encoding one or more syntax elements of the at least one non-zero transform coefficient of the current sub-block, wherein the instructions that cause the processor to use the values comprise instructions that cause the processor to:

determine a first context for entropy decoding the one or more syntax elements of the at least one non-zero transform coefficient when the values for the coded sub-block flags of the neighboring sub-blocks have a first set of values; and determine a second context for entropy decoding the one or more syntax elements of the at least one non-zero transform coefficient when the values for the coded sub-block flags of the neighboring sub-blocks have a second set of values, the first context being different than the second context and the first set of values being different than the second set of values; and entropy encode the one or more syntax elements of the individual transform coefficient using the determined context.

\* \* \* \* \*